(12) United States Patent
Linnell

(10) Patent No.: US 6,549,979 B1
(45) Date of Patent: Apr. 15, 2003

(54) ADDRESS MAPPING IN MASS STORAGE DEVICE MOUNTING SYSTEM

(75) Inventor: Thomas Linnell, Northboro, MA (US)

(73) Assignee: EMC Corporation, Hopkinton, MA (US)

( * ) Notice: Subject to any disclaimer, the term of this patent is extended or adjusted under 35 U.S.C. 154(b) by 174 days.

(21) Appl. No.: 09/877,869

(22) Filed: Jun. 7, 2001

(51) Int. Cl.⁷ .............................................. G06F 12/00
(52) U.S. Cl. ......................... 711/114; 711/202; 711/220
(58) Field of Search ............................... 711/114, 202, 711/220; 710/9, 10

(56) References Cited

U.S. PATENT DOCUMENTS

| | | | |
|---|---|---|---|
| 5,239,659 A | * 8/1993 | Rudeseal et al. ................ 714/6 |
| 5,403,639 A | * 4/1995 | Belsan et al. ................ 707/204 |
| 5,579,204 A | 11/1996 | Nelson et al. ............... 361/685 |
| 5,602,717 A | 2/1997 | Leshem et al. .............. 361/685 |
| 5,689,678 A | * 11/1997 | Stallmo et al. .............. 711/114 |
| 5,729,763 A | 3/1998 | Leshem ....................... 395/858 |
| 5,737,193 A | 4/1998 | LaRiviere et al. ........... 361/799 |
| 5,768,551 A | 6/1998 | Bleiweiss et al. ............ 395/311 |
| 5,841,997 A | 11/1998 | Bleiweiss et al. ............ 395/311 |
| 5,877,938 A | * 3/1999 | Hobbs et al. ................ 361/724 |
| 5,887,270 A | 3/1999 | Brant et al. .................. 711/162 |
| 5,898,828 A | 4/1999 | Pignolet et al. ......... 395/182.04 |
| 5,984,634 A | 11/1999 | Teachout et al. .......... 415/213.1 |
| 6,009,535 A | 12/1999 | Halligan et al. ................ 714/5 |
| 6,061,966 A | 5/2000 | Nelson et al. ................. 49/394 |
| 6,078,503 A | 6/2000 | Gallagher et al. ........... 361/725 |
| 6,088,224 A | 7/2000 | Gallagher et al. ........... 361/695 |
| 6,169,249 B1 | 1/2001 | Teachout et al. ........... 174/52.1 |
| 6,199,839 B1 | 3/2001 | Rienzo ........................ 267/136 |
| 6,289,398 B1 | * 9/2001 | Stallmo et al. ................. 710/5 |

OTHER PUBLICATIONS

Schwarz et al., "Almost Complete Address Translation (ACATS) Disk Array Declustering," pp 324–331, IEEE, 1996.*
VITESSE Semiconductor Corp., Product Brief VSC215, "Enhanced IPMI Baseboard Management Controller," pp 1–4, Mar. 29, 2000.*
VITESSE Semiconductor Corp., Product Brief SSC200, "Enclosure Management Controller," pp 1–2, 2000.*

* cited by examiner

Primary Examiner—Matthew Kim
Assistant Examiner—Stephen Elmore
(74) Attorney, Agent, or Firm—John M. Gunther; Krishnendu Gupta

(57) ABSTRACT

A technique is provided for mapping mass storage device addresses to mass storage devices mounted in a mass storage device mounting system. The mounting system may include a single type of chassis that may contemporaneously mount two sets of disk mass storage devices. One of the sets of disk mass storage devices may comprise disk mass storage device that have a first form factor (e.g., half height form factor), and the other set may comprise disk mass storage devices that have a second form factor (e.g., LP form factor).

8 Claims, 24 Drawing Sheets

| 0 | 1 | 2 | 3 | | E | F | | C | D | | | 22 | 23 | | 2E | 2F | | C | D | | | 2C | 2D |
|---|---|---|---|---|---|---|---|---|---|---|---|---|---|---|---|---|---|---|---|---|---|---|---|

ADDRESS MAPPING IN MASS STORAGE DEVICE MOUNTING SYSTEM

CROSS-REFERENCE TO RELATED APPLICATIONS

The subject matter of the subject application is related to the subject matter of the following co-pending U.S. patent applications:

U.S. patent application Ser. No. 09/877,848, entitled "Configurable Fibre Channel Loop System" filed concurrently with the subject application;

U.S. patent application Ser. No. 09/877,808, entitled "Mass Storage Device Mounting System," filed concurrently with the subject application;

U.S. patent application Ser. No. 09/343,344, entitled "Fibre Channel By-Pass," filed Jun. 30, 1999; and U.S. patent application Ser. No. 09/473,668, entitled "Fibre Channel Data Storage System," filed Dec. 29, 1999.

Each of these co-pending U.S. patent applications is owned by the owner of the subject application; the respective disclosure of each of these co-pending U.S. patent applications is hereby incorporated by reference in its entirety into the subject application.

BACKGROUND OF THE INVENTION

1. Field of the Invention

The present invention relates to a technique for the mapping of addresses to mass storage devices mounted in a mass storage device mounting system.

2. Brief Description of Related Prior Art

Network computer systems generally include a plurality of geographically separated or distributed computer nodes that are configured to communicate with each other via, and are interconnected by, one or more network communications media. One conventional type of network computer system includes a network storage subsystem that is configured to provide a centralized location in the network at which to store, and from which to retrieve data. Advantageously, by using such a storage subsystem in the network, many of the network's data storage management and control functions may be centralized at the subsystem, instead of being distributed among the network nodes.

One type of conventional network storage subsystem, manufactured and sold by the Assignee of the subject application (hereinafter "Assignee") under the tradename Symmetrix™ (hereinafter referred to as the "Assignee's conventional storage system"), includes a plurality of disk mass storage devices (e.g., disk drives) configured as one or more redundant arrays of independent (or inexpensive) disks (RAID). The disk devices are controlled by disk controllers (commonly referred to as "back end" controllers/directors) that may communicate (i.e., exchange data and commands) with the disk devices via Small Computer System Interface (SCSI) protocol communication channels. The disk controllers are coupled via a bus system to a shared cache memory resource in the subsystem. The cache memory resource is also coupled via the bus system to a plurality of host controllers (commonly referred to as "front end" controllers/directors). The disk controllers are coupled to respective disk adapters that, among other things, interface the disk controllers to the disk devices. Similarly, the host controllers are coupled to respective host channel adapters that, among other things, interface the host controllers via channel input/output (I/O) ports to the network communications channels (e.g., SCSI, Enterprise Systems Connection (ESCON), or FC based communications channels) that couple the storage subsystem to computer nodes in the computer network external to the subsystem (commonly termed "host" computer nodes or "hosts").

In the Assignee's conventional storage system, the disk devices are grouped together into respective sets, and each set of disk devices may be controlled by respective pair of disk controllers. If one of the disk controllers in the respective pair fails, the other (i.e., redundant) disk controller in the pair may assume the duties of the failed disk controller, and thereby permit the set of disk devices to continue to operate, despite the failure of the failed disk controller.

Also in the Assignee's conventional storage system, the disk devices are placed in respective housings and stored in one or more chassis. The chassis may include a multiplicity of sets of slots for receiving respective housings within which the respective disk devices are placed. The chassis may also include an electrical back plane having a multiplicity of electromechanical connectors. The connectors may be mated with respective electromechanical connectors of the housings to electrically and mechanically couple the disk devices to the chassis.

In general, two types of commercially-available disk devices may be mounted in the chassis used in the Assignee's conventional storage system: "low profile" and "half-high" form factor disk devices. With the exception of their respective heights, a low profile form factor disk device (hereinafter "LP device") may have identically the same dimensions as a half-high form factor disk device (hereinafter "HH device"). An LP device may have a height of 1 inch; an HH device may have a height of 1.6 inches.

At present, the storage capacity of a HH device may be approximately twice that of a LP device. However, the speed with which data may be read from or written to a HH device may be slower than the speed with which data may be read from or written to a LP device.

Only two types of chassis may be used in the Assignee's conventional storage system. One type of chassis is configured to receive and mount only LP devices, and the other type of chassis is configured to receive and mount only HH devices. Thus, in the Assignee's conventional storage system, a single chassis cannot contemporaneously receive and store both LP and HH devices; instead, all of the disk devices stored in a single chassis must have a single form factor (i.e., LP or HH).

This is unfortunate, since, given the above-described relative differences in the capabilities of HH and LP devices, in certain practical applications of a data storage system, it may be desirable to employ in an individual chassis combinations of both HH and LP devices that, when taken together, may permit the overall performance of the system to be improved. Also unfortunately, since an individual chassis used in the Assignee's conventional data storage system is unable to receive and store disk devices having multiple different form factors, this inherently reduces the design flexibility of the data storage system. Thus, it would be desirable to provide a mass storage device mounting system that may use a single type of chassis that is able to contemporaneously receive and store disk mass storage devices that have different form factors (e.g., receive and store combinations of both HH and LP devices).

Additionally, it has been proposed to replace with FC protocol communication channels the SCSI communication channels that permit communication among the disk devices and disk controllers in the Assignee's conventional data storage system, in order to increase the speed with which such communication may be performed. According to this proposal, each such FC communication channel may comprise a serial, unidirectional, FC communication ring or loop system.

It would also be desirable to provide a technique that may be used to assign FC communication loop addresses to mass storage devices mounted in one or more of the aforesaid type of chassis (i.e., the chassis that is able to receive and store contemporaneously disk devices having multiple different form factors). It would also be desirable to provide such a technique that would permit a maximum number of mass storage devices to be used in a single such FC loop, and would reduce the possibility that human error and/or addressing conflicts may be introduced into the addresses assigned to the mass storage devices.

SUMMARY OF THE INVENTION

In accordance with the present invention, a technique is provided for mapping/assigning addresses to mass storage devices in a mass storage device mounting system that overcomes the aforesaid and other disadvantages of the prior art. More specifically, in one embodiment of the present invention, a method is provided for assigning numerical addresses to mass storage devices mounted in a mass storage device mounting system. The mounting system may be of the type, disclosed in the aforesaid copending U.S. patent application Ser. No. 09/877,808, entitled "Mass Storage Device Mounting System," filed concurrently with the subject application. As is disclosed in said copending application, this type of mounting system includes one or more electrical cabinets or chassis, and is able to mount different respective configurations of mass storage devices. Each of the chassis in the mounting system is able to contemporaneously receive and store a respective combination of disk mass storage devices. The respective combination of disk mass storage devices may include both HH and LP devices.

The method of this embodiment of the present invention may include assigning a first subset of the numerical addresses to a first subset of the mass storage devices mounted in a first chassis in the mounting system. A second subset of the numerical addresses may be assigned to a second subset of the mass storage devices mounted in a second chassis in a second chassis in the mounting system. The assigning of the first and second subsets of the numerical addresses may be based upon (1) an actual configuration of the mass storage devices mounted in the mounting system, and (2) respective addresses assigned to the first chassis and to the second chassis.

Each respective address in the second subset of the numerical addresses may be equal to a respective combination of both a respective corresponding address in the first subset of the numerical addresses and the address assigned to the second chassis. More specifically, each respective address in the second subset of the numerical addresses may be equal to a respective summation of both a respective corresponding address in the first subset of the numerical addresses and the address assigned to the second chassis. The address assigned to the second chassis may be generated by a hardwired connection provided by a special cable connecting the second chassis to a port of a disk adapter. The respective corresponding address may be pre-assigned to a respective connector via which a respective mass storage device is coupled to a back plane in the mounting system.

The first subset of the numerical addresses may comprise only addresses that are greater than or equal to 0 hexadecimal and less than 20 hexadecimal. The second subset of the numerical addresses may comprise only address that are greater than or equal to 20 hexadecimal and less than 40 hexadecimal.

If the actual configuration of the mass storage devices mounted in the mounting system is a first configuration, the mounting system may also include a third chassis and a fourth chassis. When this first configuration of the mass storage devices is mounted in the mounting system, the method of this embodiment may also include the steps of assigning a third subset of the numerical addresses to a third subset of the mass storage devices mounted in the third chassis, and assigning a fourth subset of the numerical address to a fourth subset of the mass storage device mounted in the fourth chassis.

When the first configuration of the mass storage devices is mounted in the mounting system, a first subset of the numerical addresses may include only addresses that are greater than or equal to 0 hexadecimal and less than 20 hexadecimal. The second subset of the numerical addresses may include only addresses that are greater than or equal to 20 hexadecimal and less than 40 hexadecimal. The third subset of the numerical addresses may include only addresses that are greater than or equal to 40 hexadecimal and less than 60 hexadecimal. The fourth subset of the numerical addresses may include only addresses that are greater than or equal to 60 hexadecimal and less than or equal to 7D hexadecimal. In this first configuration of the mass storage devices, the first, second, third, and fourth chassis may mount only disk mass storage devices that have a half height form factor.

Alternatively, in this first configuration, the first, second, third, and fourth chassis may mount respective combinations of mass storage devices. Each of the respective combinations of mass storage devices may include both mass storage devices that have a half height form factor and mass storage devices that have a low profile form factor.

The mass storage devices that are assigned the addresses according to this embodiment of the present invention may communicate with one or more disk controllers via an FC arbitrated loop (AL) network. The addresses that are assigned to the mass storage devices mounted in the mounting system may be FC loop network logical addresses that may used by the one or more disk controllers to facilitate communications with the mass storage devices via the FC communication system.

In this embodiment of the method, FC loop addresses 7E hexadecimal and 7F hexadecimal may be reserved. Thus, as will be appreciated by those skilled in the art, given these address reservations, and the inherent limitations imposed by FC protocol on the maximum number FC devices that may be addressed on a single FC loop, 7D hexadecimal is the maximum FC loop address that may be assigned to a mass storage device that may be coupled to such a FC loop network.

Thus, advantageously, the technique of the present invention may be used to map/assign FC loop addresses to disk mass storage devices mounted in a mounting system of the type of disclosed in the aforesaid copending U.S. patent application Ser. No. 09/877,808, entitled "Mass Storage Device Mounting System," filed concurrently with the subject application. Also advantageously, the technique of the present invention may permit a maximum number of such mass storage devices to be useable in a single FC loop.

Depending upon the actual configuration of the mass storage devices in the mounting system, the mass storage devices may be coupled to different chassis back plane connectors and therefore, theological addresses that may be assigned to the mass storage devices may differ depending upon said actual configuration. Furthermore, addresses may be assigned to the mass storage devices based upon the connectors that couple the devices to the mounting system chassis, and the cables that couple the chassis to the disk adapters. Advantageously, this may reduce the possibility that human error and/or addressing conflicts may be introduced into the addresses assigned to the mass storage devices, since the process of assigning the addresses may be substantially automated.

These and other features and advantages of the present invention will become apparent as the following Detailed Description proceeds and upon reference to the Figures of the Drawings, in which like numerals depict like parts, and wherein:

BRIEF DESCRIPTION OF THE DRAWINGS

FIG. 21 is a highly schematic diagram illustrating assignment, according to an embodiment of the present invention, of logical addresses to mass storage devices mounted in multiple chassis according to a first possible configuration of mass storage devices in the mass storage system of FIG. 3.

FIG. 22 is a highly schematic diagram illustrating assignment, according to an embodiment of the present invention, of logical addresses to mass storage devices mounted in multiple chassis according to a second possible configuration of mass storage devices in the mass storage system of FIG. 3.

FIG. 23 is a highly schematic diagram illustrating assignment, according to an embodiment of the present invention, of logical addresses to mass storage devices mounted in multiple chassis according to a third possible configuration of mass storage devices in the mass storage system of FIG. 3.

Although the following Detailed Description will proceed with reference being made to illustrative embodiments and methods of use of the present invention, it should be understood that it is not intended that the present invention be limited to these illustrative embodiments and methods of use. On contrary, many alternatives, modifications, and equivalents of these illustrative embodiments and methods of use will be apparent to those skilled in the art. Accordingly, the present invention should be viewed broadly as encompassing all such alternatives, modifications, and equivalents as will be apparent to those skilled in art, and should be viewed as being defined only as forth in the hereinafter appended claims.

DETAILED DESCRIPTION OF ILLUSTRATIVE EMBODIMENTS

Figure 1:
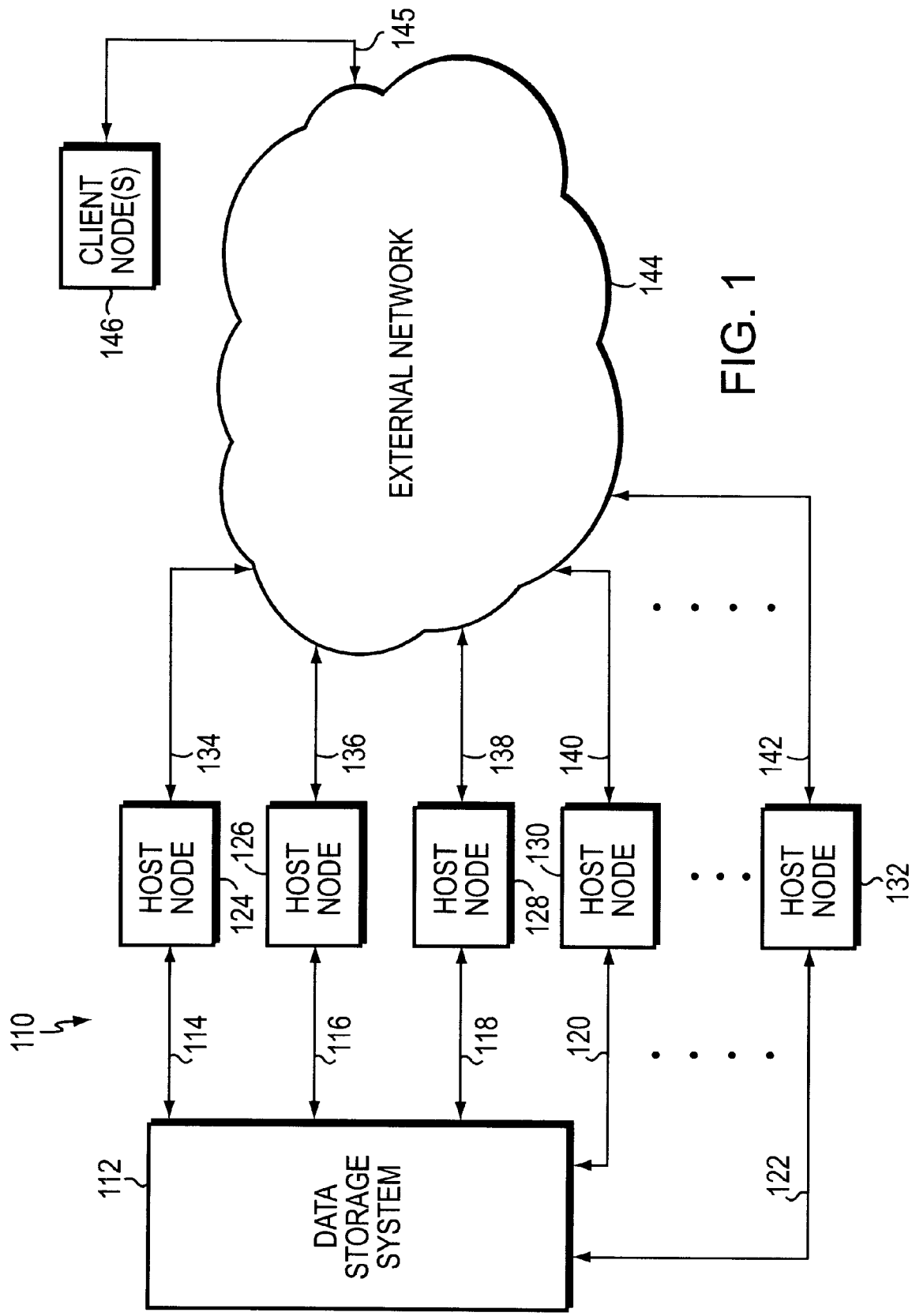
FIG. 1 is a high-level schematic block diagram of a data storage network that includes a data storage system wherein one embodiment of the present invention may be practiced to advantage.

Turning now to FIGS. 1 to 24, illustrative embodiments of the present invention will be described. FIG. 1 is a high level block diagram illustrating a data storage network 110 that includes a data storage system 112 wherein one embodiment of the subject invention may be practiced to advantage. System 112 is coupled via FC protocol optical communication links 114, 116, 118, 120, . . . 122 to respective host computer nodes 124, 126, 128, 130, . . . 132. Host nodes 124, 126, 128, 130, . . . 132 are also coupled via additional respective conventional network communication links 134, 136, 138, 140, . . . 142 to an external network 144. Network 144 may comprise one or more Transmission Control Protocol/Internet Protocol (TCP/IP)-based and/or Ethernet-based local area and/or wide area networks. Network 144 is also coupled to one or more client computer nodes (collectively or singly referred to by numeral 146 in FIG. 1)

via network communication links (collectively referred to by numeral 145 in FIG. 1). The network communication protocol or protocols utilized by the links 134, 136, 138, 140, . . . 142, and 145 are selected so as to ensure that the nodes 124, 126, 128, 130, . . . 132 may exchange data and commands with the nodes 146 via network 144.

Host nodes 124, 126, 128, 130, . . . 132 may be any one of several well known types of computer nodes, such as server computers, workstations, or mainframes. In general, each of the host nodes 124, 126, 128, 130, . . . 132 and client nodes 146 comprises a respective computer-readable memory (not shown) for storing software programs and data structures associated with, and for carrying out the functions and operations described herein as being carried by these nodes 124, 126, 128, 130, . . . 132, and 146. In addition, each of the nodes 124, 126, 128, 130, . . . 132, and 146 further includes one or more respective processors (not shown) and network communication devices for executing these software programs, manipulating these data structures, and for permitting and facilitating exchange of data and commands among the host nodes 124, 126, 128, 130, . . . 132 and client nodes 146 via the communication links 134, 136, 138, 140, . . . 142, network 144, and links 145. The execution of the software programs by the processors and network communication devices included in the hosts 124, 126, 128, 130, . . . 132 also permits and facilitates exchange of data and commands among the nodes 124, 126, 128, 130, . . . 132 and the system 112 via the FC links 114, 116, 118, 120, . . . 122, in the manner that will be described below.

Figure 2:
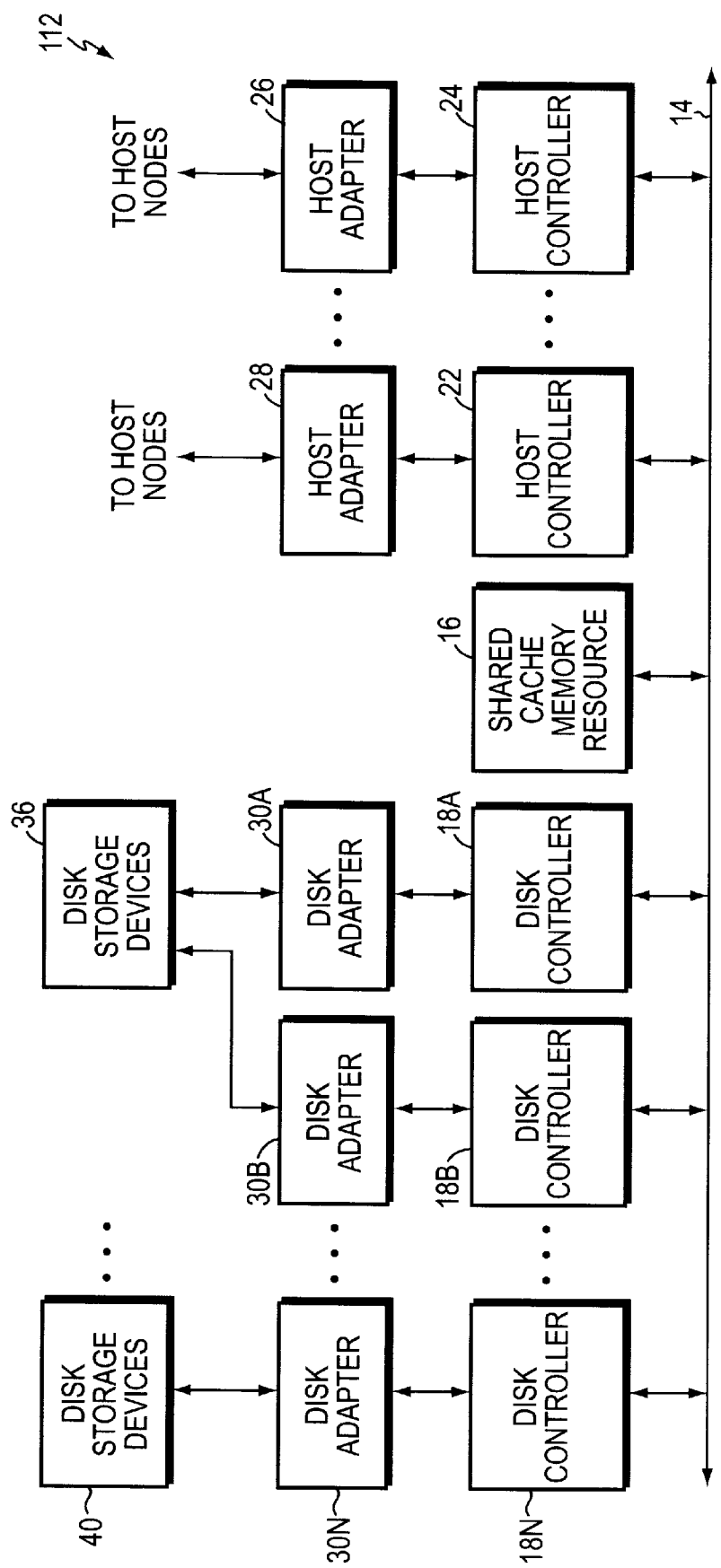
FIG. 2 is a high-level schematic block diagram illustrating functional components of the data storage system included in the data storage network shown in FIG. 1.

FIG. 2 is a high-level schematic block diagram of functional components of the system 112. System 112 may include a bus system 14 that electrically couples together a plurality of host controllers 22 . . . 24, a plurality of disk controllers 18A . . . 18N, and a shared cache memory resource 16. Bus system 14 may include a plurality of redundant buses (not shown) and a bus arbitration and control system (also not shown).

Each host controller 22 . . . 24 may comprise a single respective circuit board or panel. Likewise, each disk controller 18A . . . 18N may comprise a single respective circuit board or panel. Each disk adapter 30A . . . 30N may comprise a single respective circuit board or panel. Likewise, each host adapter 26 . . . 28 may comprise a single respective circuit board or panel. Each host controller 22 . . . 24 may be electrically and mechanically coupled to a respective host adapter 28 . . . 26, respectively, via a respective mating electromechanical coupling system. Similarly, each disk controller 18A . . . 18N may be electrically and mechanically coupled to a respective disk adapter 30A . . . 30N, respectively, via a respective mating electromechanical coupling system.

In this embodiment of system 112, although not shown explicitly in the Figures, each host adapter 26 . . . 28 may be coupled to four respective host nodes via respective FC links. For example, in this embodiment of system 112, adapter 26 may be coupled to host nodes 124, 126, 128, 130 via respective FC links 114, 116, 118, 120. It should be appreciated that the number of host nodes to which each host adapter 26 . . . 28 may be coupled may vary, depending upon the particular configurations of the host adapters 26 . . . 28, and host controllers 22 . . . 24, without departing from the present invention.

System 112 also includes a plurality of sets of disk mass storage devices 36 . . . 40. As is described more fully below, in system 112, a failover redundancy arrangement may be implemented wherein each of the sets of mass storage devices is controlled by a respective pair of disk controllers. For example, the set of devices 36 may be controlled by disk controllers 18A, 18B. Each of the disk controllers 18A, 18B may exchange data and commands with the devices 36 via a respective disk adapter 30A, 30B. That is, each disk adapter 30A, 30B may be electrically coupled to devices 36, and may interface the respective disk controller 18A, 18B with which it is associated to devices 36 so as to permit exchange of data and commands between processors (not shown) in the disk controllers 18A, 18B and the storage devices in the set 36 using, e.g., an FC communication protocol. The devices 36 . . . 40 may be configured as redundant arrays of disk mass storage devices. Although not shown in the Figures, it should be understood that the devices 40 may also be controlled by a respective pair of disk controllers, which pair may comprise controller 18N and another disk controller (not shown).

It should be appreciated that the respective numbers of the respective functional components of system 112 shown in FIG. 2 are merely for illustrative purposes, and depending upon the particular application to which the system 112 is intended to be put, may vary without departing from the present invention. For example, it may be desirable to permit other functional components in the system 112 to be capable of failover fault tolerance. Thus, in practical implementation of the system 112, it may be desirable that the system 112 include additional redundant functional components (e.g., redundant pairs of host controllers, etc.) and mechanisms for ensuring that the failure of any functional component is detected and the operations of any failed functional component are assumed by a respective redundant functional component of the same type as the failed component.

The general manner in which data may be retrieved from and stored in the system 112 will now be described. Broadly speaking, in operation of network 110, a client node 146 may forward a request to retrieve data to a host node (e.g., node 124) via one of the links 145 associated with the client node 146, network 144 and the link 134 associated with the host node 124. If data being requested is not stored locally at the host node 124, but instead, is stored in the data storage system 112, the host node 124 may request the forwarding of that data from the system 112 via the FC link 114 associated with the node 124.

The request forwarded via link 114 is initially received by the host adapter 26 coupled to that link 114. The host adapter 26 associated with link 114 may then forward the request to the host controller 24 to which it is coupled. In response to the request forwarded to it, the host controller 24 may then ascertain from data storage management tables (not shown) stored in the cache 16 whether the data being requested is currently in the cache 16; if the requested data is currently not in the cache 16, the host controller 24 may request that a disk controller (e.g., controller 18A) that is actively controlling the storage devices in set 36 within which the requested data is stored retrieve the requested data into the cache 16. In response to the request from the host controller 24, the disk controller 18A may forward via the disk adapter 30A to which it is coupled appropriate commands for causing one or more of the disk devices in set 36 to retrieve the requested data. In response to such commands, these disk devices 36 may forward the requested data to the disk controller 18A via the disk adapter 30A. The disk controller 18A may then store the requested data in the cache 16.

When the requested data is in the cache 16, the host controller 22 may retrieve the data from the cache 16 and forward it to the host node 124 via the adapter 26 and link 114. The host node 124 may then forward the requested data to the client node 146 that requested it via the link 134, network 144 and the link 145 associated with the client node 146.

Additionally, a client node 146 may forward a request to store data to a host node (e.g., node 124) via one of the links 145 associated with the client node 146, network 144 and the link 134 associated with the host node 124. The host node 124 may store the data locally, or alternatively, may request the storing of that data in the system 112 via the FC link 114 associated with the node 124.

The data storage request forwarded via link 114 is initially received by the host adapter 26 coupled to that link 114. The host adapter 26 associated with link 114 may then forward the data storage request to the host controller 24 to which it is coupled. In response to the data storage request forwarded to it, the host controller 24 may then initially store the data in cache 16. Thereafter, one of the disk controllers (e.g., controller 18A) may cause that data stored in the cache 16 to be stored in one or more of the data storage devices in the set 36 that it is actively controlling, by issuing appropriate commands for same to these devices via its associated adapter 30A.

Figure 3:
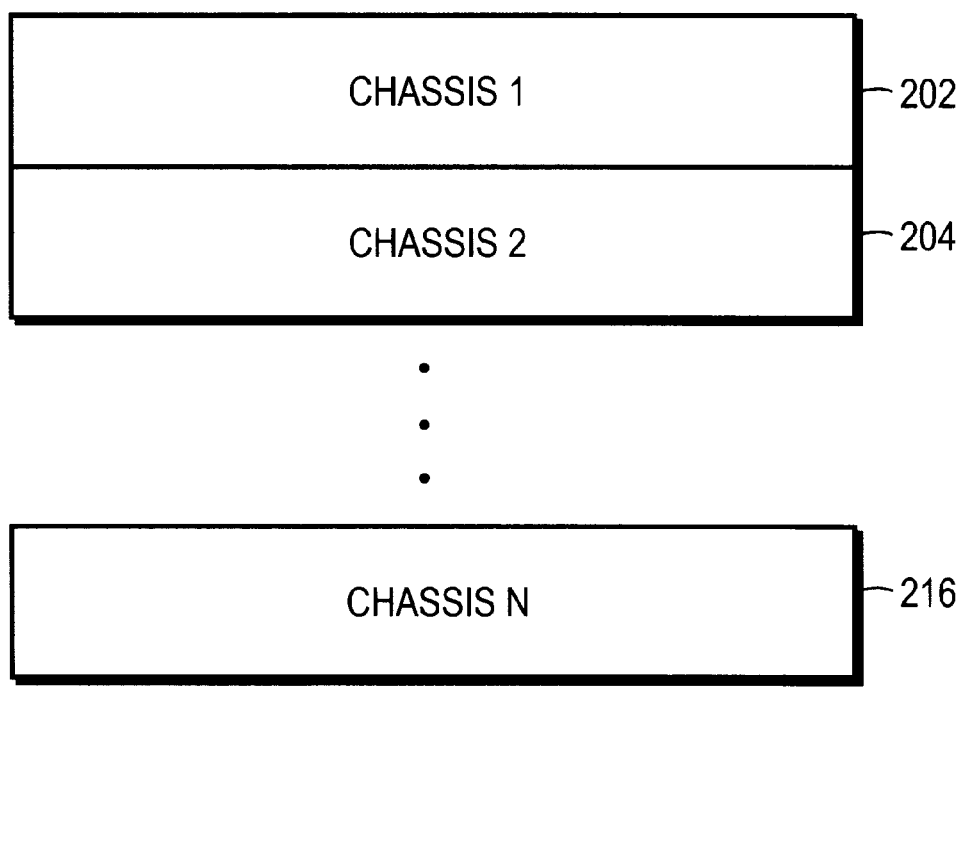
FIG. 3 is a schematic diagram illustrating features of a mass storage device mounting system that may be used to house mass storage devices that may be assigned addresses in accordance with one embodiment of the present invention.

One or more of the sets of the disk devices 36 . . . 40 in system 112 is stored and mounted in at least one disk device mounting system 200 of the type described in the aforesaid copending U.S. patent application Ser. No. 09/877,808, entitled "Mass Storage Device Mounting System," filed concurrently with the subject application. As shown in FIG. 3, depending upon the number of disk devices 36 . . . 40 stored in mounting system 200, system 200 may comprise one disk mounting chassis 202, or a plurality of such chassis 202, 204, . . . 216. The respective construction and operation of each respective chassis 202, 204, . . . 216 are substantially identical. Accordingly, for purposes of avoiding unnecessary duplication of description, the construction and operation of one 202 of the chassis in mounting system 200 will be described herein, with particular reference being made to FIGS. 4–7.

Figure 4:
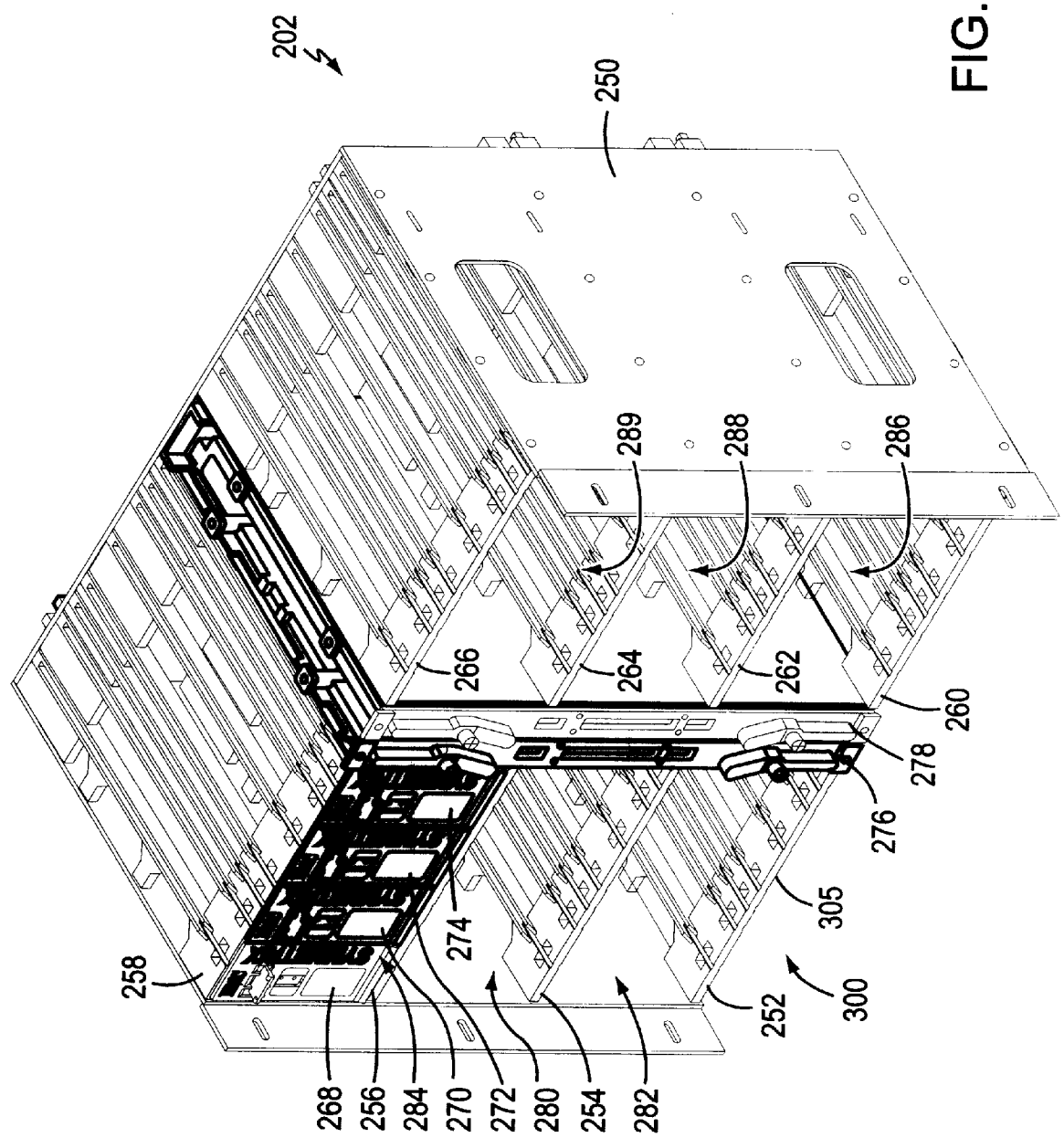
FIG. 4 is a front isometric view of a chassis/electrical cabinet comprised. in the mounting system of FIG. 3.
Figure 5:
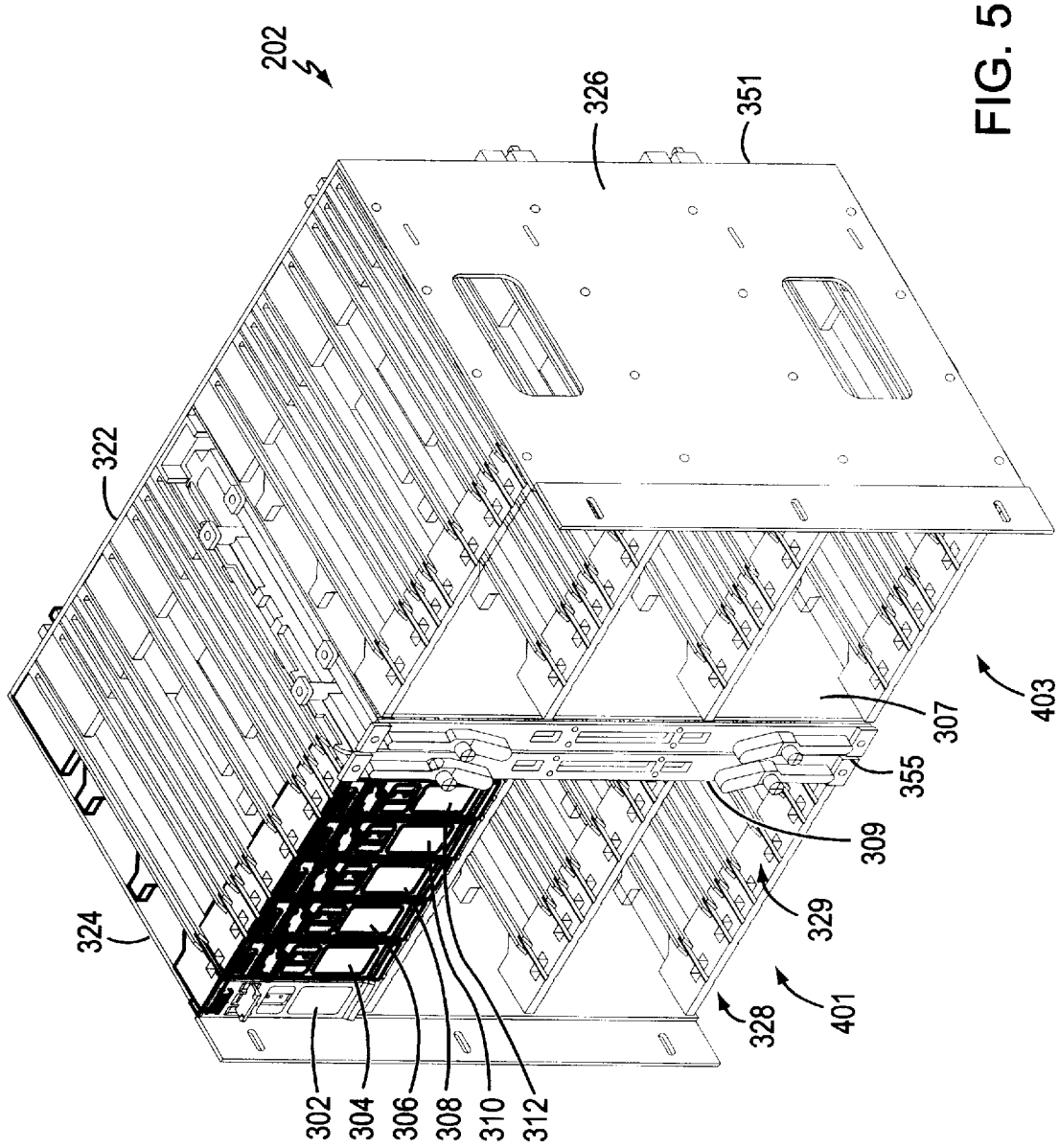
FIG. 5 is another front isometric view of the chassis/cabinet of FIG. 4.

Referring specifically to FIGS. 4–5, chassis 202 comprises an electrical cabinet 250 that includes two generally rectangular, identically dimensioned side panels 324, 326 that are mounted by conventional means to a generally rectangular electrical back plane 322. The panels 324, 326 extend parallel to each other and are orthogonal to the back plane 322. Cabinet 250 (see FIG. 4) also includes two generally rectangular, identically dimensioned panels 307, 309 that extend parallel to each other and to the panels 324, 326 in the cabinet 250. Panels 307, 309 are mounted to the back plane 322 and to a plurality of identically constructed racks 252, 254, 256, 258, 260, 262, 264, 266 (whose purpose will be described below) by conventional means (not shown). Racks 252, 254, 256, 258, 260, 262, 264, 266 extend parallel to each other, but are orthogonal to the panels 307, 309, 324, 326 and to the back plane 322.

The back plane 322, side panels 324, 326, and racks 252, 258, 260, 266 of the chassis 202 together partially enclose and define a volume or space 300 for receiving and storing disk devices. Space 300 is internal to the chassis 202, and is segmented by panels 307, 309 into two equal volumes or regions 401, 403. Region 401 is segmented by racks 254 and 256 into three equal volumes or regions 280, 282, 284. Similarly, region 403 is segmented by racks 262 and 264 into three equal volumes or regions 286, 288, 289. Each of the regions 280, 282, 284, 286, 288, 289 may, in turn, be divisible into two equally sized volumes or regions.

Figure 13:
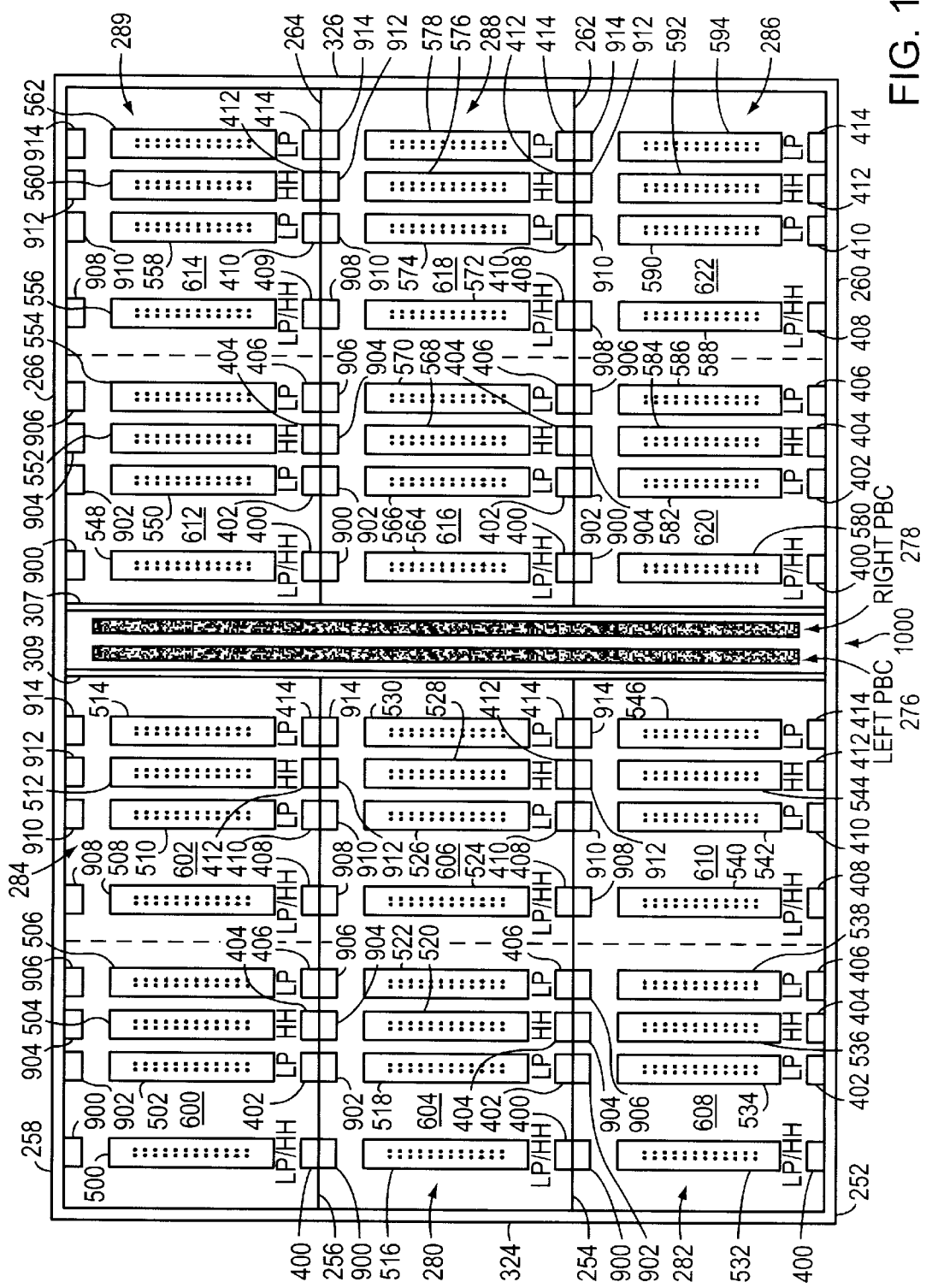
FIG. 13 is a highly schematic diagram illustrating the layout of certain features of the chassis of FIG. 4, and wherein tracks are represented by blocks, and the tracks in the top surface of the top rack and in the bottom surface of the bottom rack of the chassis are not shown for purposes of clarity of illustration.

For example, as is indicated symbolically by dashed lines in FIG. 13, region 282 may be divided into two equally sized regions 608, 610. Region 280 may be divided into two equally sized regions 604, 606. Region 284 may be divided into two equally sized regions 600, 602. Region 289 may be divided into two equally sized regions 612, 614. Region 288 may be divided into two equally sized regions 616, 618. Region 286 may be divided into two equally sized regions 620, 622.

The respective construction of each of the racks 252, 254, 256, 258, 260, 262, 264, 266 is substantially identical. Accordingly, for purposes of avoiding unnecessary duplication of description, the construction of one 252 of the racks 252, 254, 256, 258, 260, 262, 264, 266 will be described herein.

Figure 6:
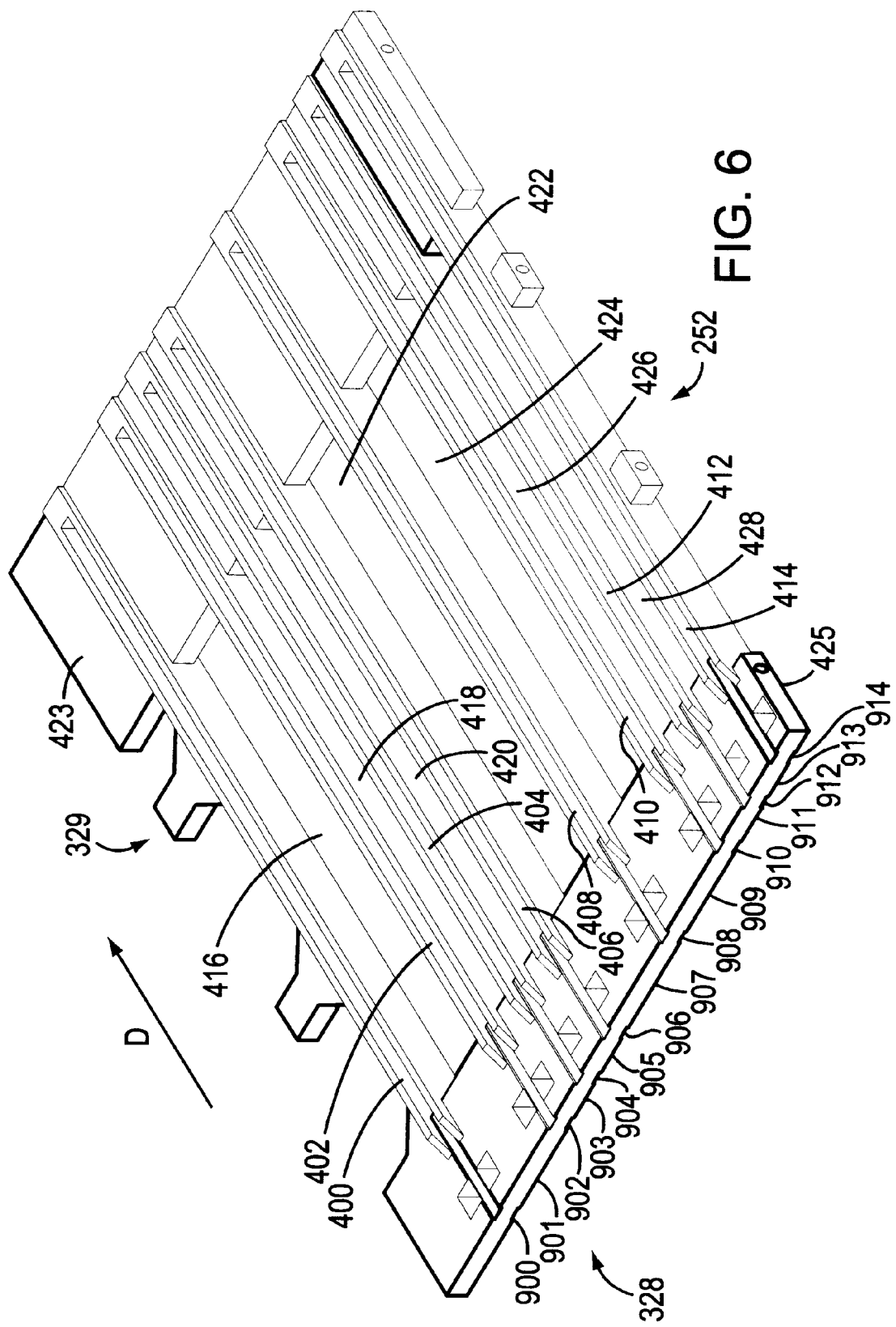
FIG. 6 is a front isometric view of a rack comprised in the chassis/cabinet of FIG. 4.

As shown in FIG. 6, rack 252 includes two respective multiplicities of tracks or slots (collectively referred to by numerals 328 and 329, respectively). Tracks 329 are located in a top surface 423 of the rack 252, and tracks 328 are located in a bottom, oppositely facing surface 425 of the rack 252. Set 329 includes a plurality of tracks or slots 400, 402, 404, 406, 408, 410, 412, 414. Set 328 includes a respective plurality of tracks or slots 900, 902, 904, 906, 908, 910, 912, 914 that are respectively positioned in corresponding positions in surface 425 directly beneath the slots 400, 402, 404, 406, 408, 410, 412, 414 of set 329. Each of the slots 400, 402, 404, 406, 408, 410, 412, 414, 900, 902, 904, 906, 908, 910, 912, 914 extends longitudinally substantially the entire length of the rack 252 from the front 305 of the chassis 202 toward the back plane 322.

The tracks 400, 402, 404, 406, 408, 410, 412, 414 in the top surface 423 of the rack 252 are separated from each other in a transverse direction of the rack 252 by recesses 416, 418, 420, 422, 424, 426, 428. Similarly, the tracks 900, 902, 904, 906, 908, 910, 912, 914 in the bottom surface 425 are separated from each other in the transverse direction of the rack 252 by recesses 901, 903, 905, 907, 909, 911, 913. More specifically, tracks 400, 402 are separated from each other by recess 416, tracks 402, 404 are separated from each other by recess 418, tracks 404, 406 are separated from each other by recess 420, tracks 406, 408 are separated from each other by recess 422, tracks 408, 410 are separated from each other by recess 424, tracks 410, 412 are separated from each other by recess 426, and tracks 412, 414 are separated from each other by recess 428, respectively. Similarly, tracks 900, 902 are separated from each other by recess 901, tracks 902, 904 are separated from each other by recess 903, tracks 904, 906 are separated from each other by recess 905, tracks 906, 908 are separated from each other by recess 907, tracks 908, 910 are separated from each other by recess 909, tracks 910, 912 are separated from each other by recess 911, and tracks 912, 914 are separated from each other by recess 913, respectively.

Figure 7:
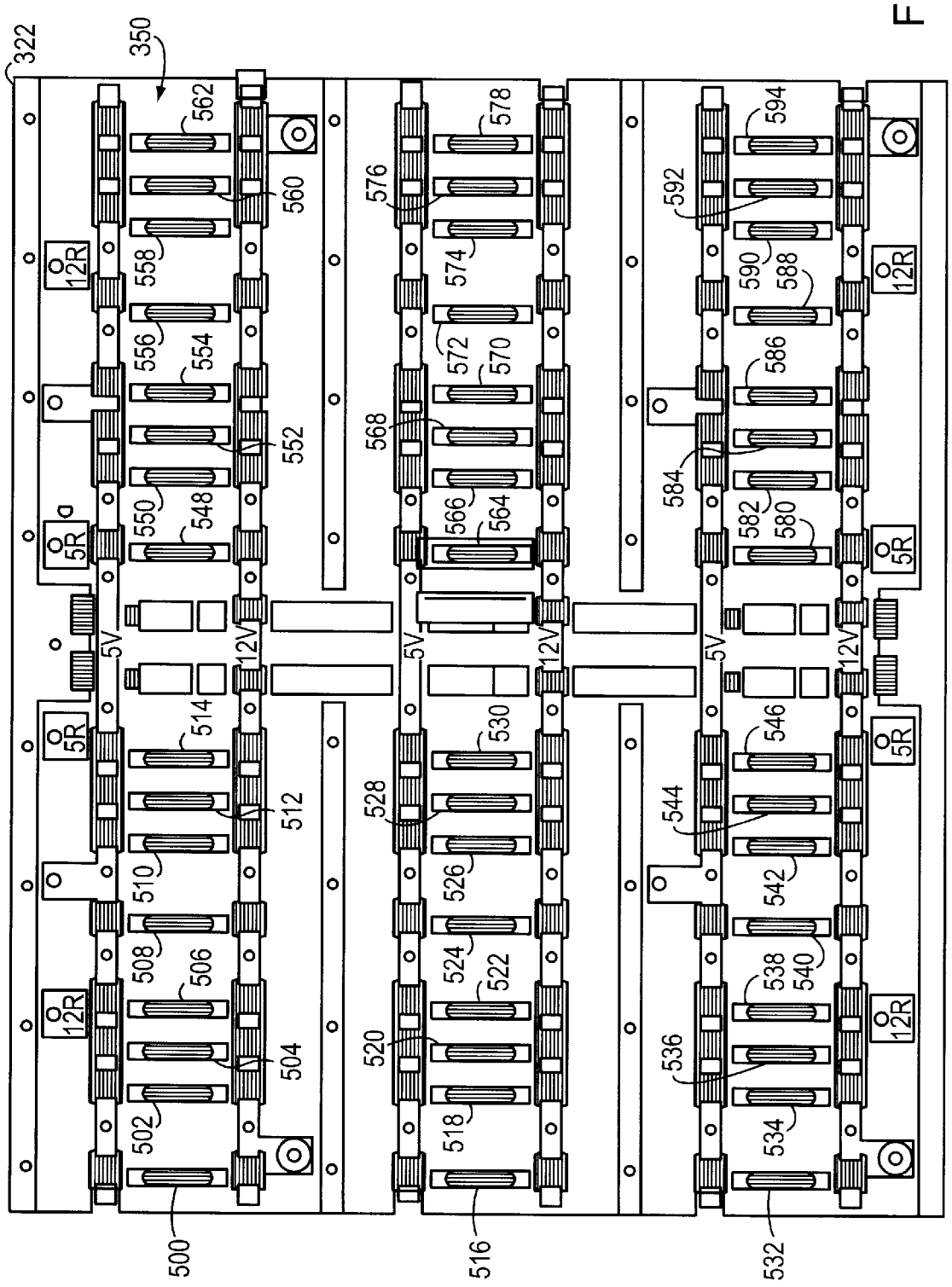
FIG. 7 is a plan view of a portion of the front of a back plane comprised in the mounting system of FIG. 3.

As shown in FIG. 7, back plane 322 includes a front surface 350 that faces toward, and a back surface 351 that faces away from, the front 305 (see FIG. 4) of the chassis 202. Chassis 202 includes a plurality of electromechanical connectors 500, 502, 504, 506, . . . 594 that are mounted in, and extend from the front surface 350 of the back plane 322, into the space 300. More specifically, the connectors 500, 502, 504, 506, . . . 594 are positioned in the chassis 202 such that each of the regions 600, 602, 604, 606, 608, 610, 612, 614, 616, 618, 620, 622 contains four respective connectors (see FIG. 13). As is shown in FIG. 13, region 600 contains connectors 500, 502, 504, 506; region 602 contains connectors 508, 510, 512, 514; region 604 contains connectors 516, 518, 520, 522; region 606 contains connectors 524, 526, 528, 530; region 608 contains connectors 532, 534, 536, 538; region 610 contains connectors 540, 542, 544, 546;

region 612 contains connectors 548, 550, 552, 554; region 614 contains connectors 556, 558, 560, 562; region 616 contains connectors 564, 566, 568, 570; region 618 contains connectors 572, 574, 576, 578; region 620 contains connectors 580, 582, 584, 586; and region 622 contains connectors 588, 590, 592, 594.

As is described more fully below, the connectors 500, 502, 504, 506, . . . 594 are electrically connected via circuit connections (not shown) in the back plane 322 to a configurable FC communication system 1000 of the type disclosed in the aforesaid copending U.S. patent application Ser. No. 09/877,848, entitled "Configurable Fibre Channel Loop System," filed concurrently with the subject application. System 1000 includes two FC port bypass circuit (PBC) cards 276, 278 (see FIG. 13) that are coupled to the not shown circuit connections in the back plane 322 via not shown mating electromechanical connectors. When disk mass storage devices comprised in the set 36 are mounted in the chassis 202 in the manner that will be described below, the PBC cards 276, 278 may permit, among other things, these disk devices to be electrically coupled to disk adapters 30A, 30B in the system 112 such that disk controllers 18A, 18B and these disk devices may exchange data and commands using FC protocol-based communication techniques. A panel 355 may be mounted to the back plane 322 in-between the panels 307, 309 so as to form respective slots for receiving and housing the respective PBC cards 276, 278. Alternatively, panel 355 need not be included in the system 112, without departing from the present invention.

Each of the disk mass storage devices that may be mounted in chassis 202 is housed in and attached to a respective housing or carrier device. Depending upon the respective form factor of the disk mass storage device (i.e., HH or LP), the carrier housing the respective disk mass storage device may be one of two possible types. For example, the type of carrier (hereinafter "HH carrier") that is used to house an HH device has the construction illustrated in FIGS. 8–10. Conversely, the type of carrier (hereinafter "LP carrier") that is used to house an LP device has the construction illustrated in FIGS. 11–12. That is, each HH device mounted in the chassis 202 may be housed in a respective HH carrier of the type illustrated in FIGS. 8–10, and each LP device mounted in the chassis 202 may be housed in a respective LP carrier of the type illustrated in FIGS. 11–12.

Figure 8:
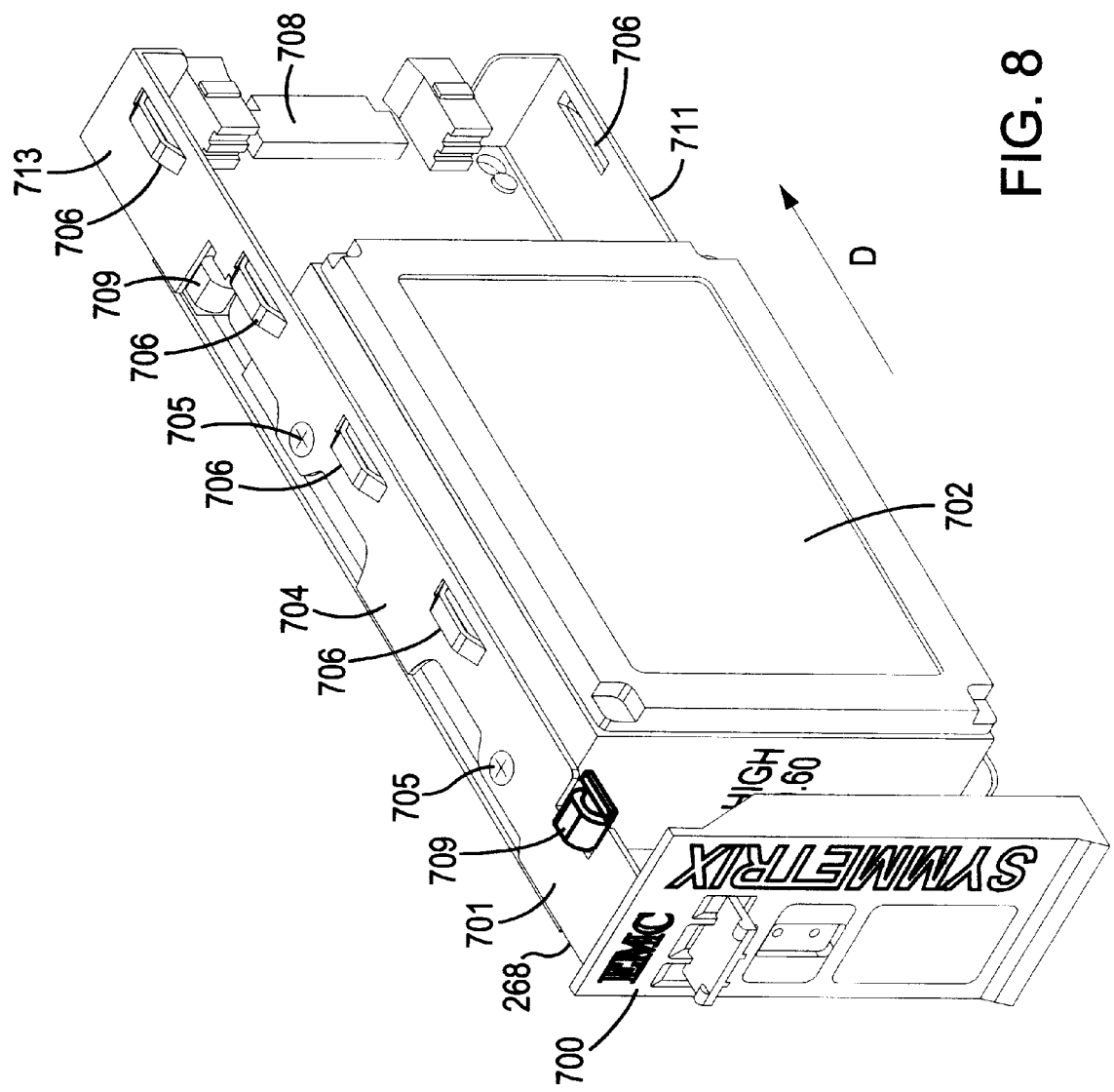
FIG. 8 is a front isometric view of a housing or carrier device that may be used in the chassis/cabinet of FIG. 4, which carrier device is shown attached to and partially enclosing an HH device (i.e., a half-high disk drive unit).
Figure 9:
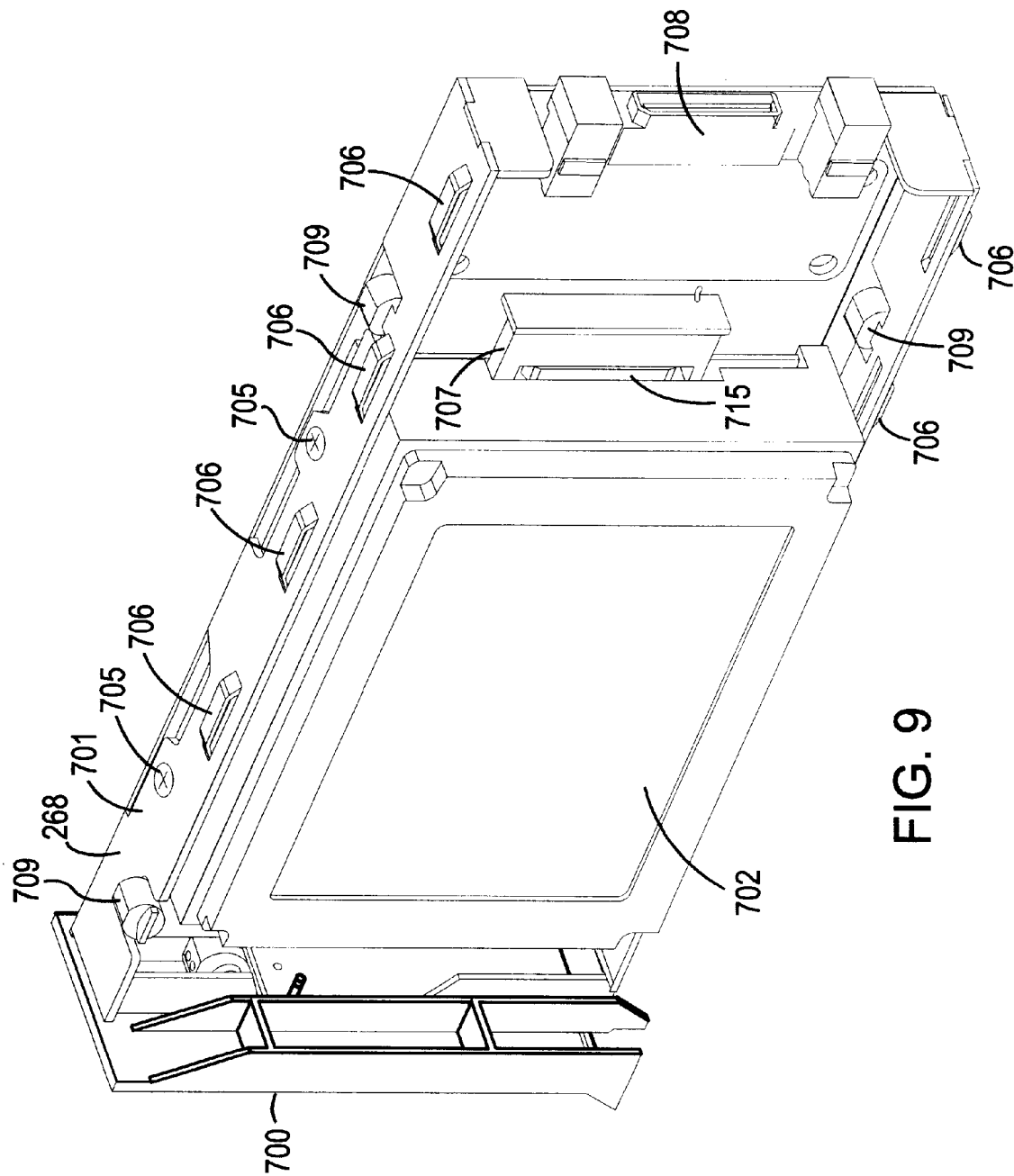
FIG. 9 is a side elevational view of the housing of FIG. 8.
Figure 10:
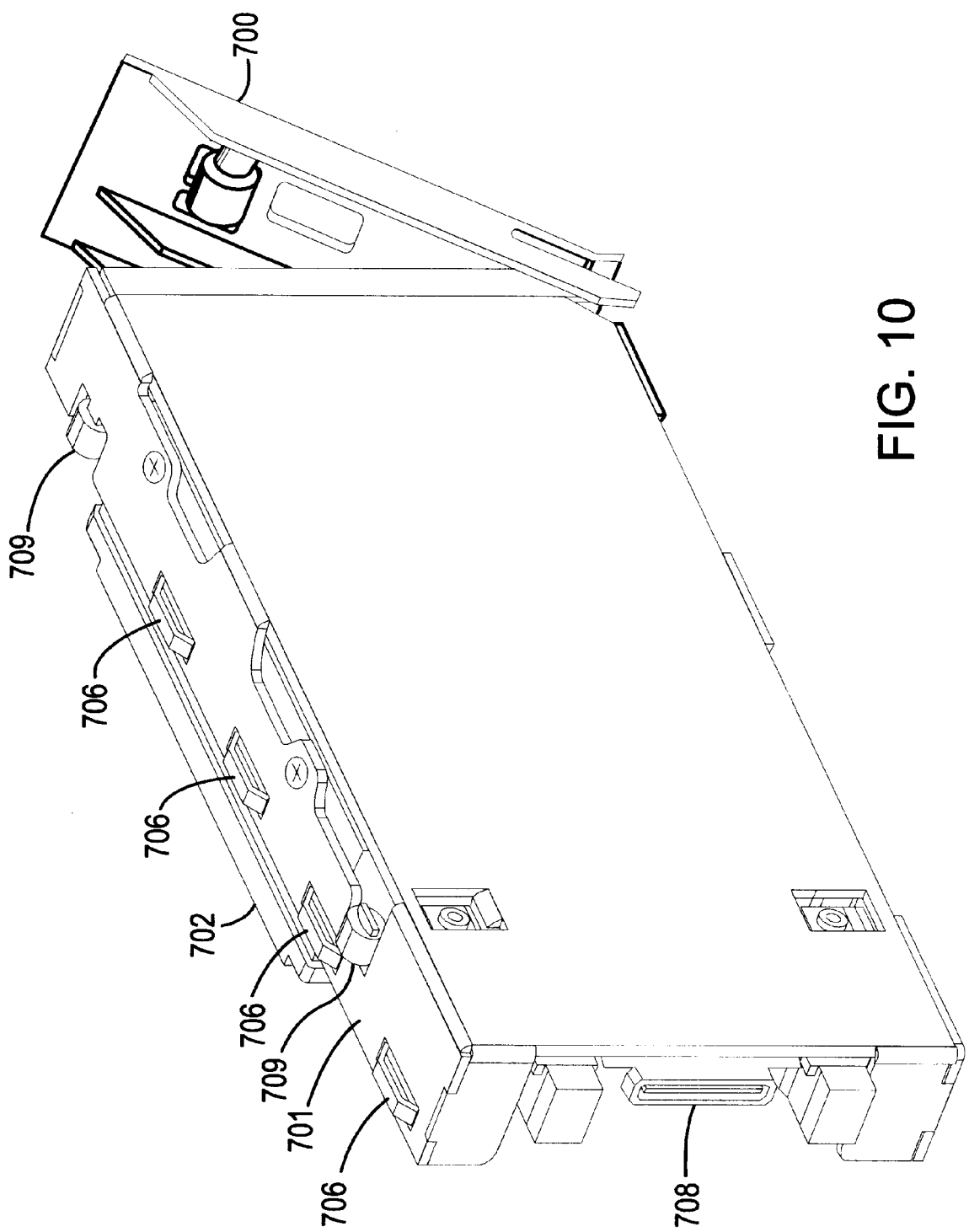
FIG. 10 is a rear isometric view of the housing of FIG. 8, shown with the front lock handle open.

As shown in FIGS. 8–10, an HH carrier (e.g., HH carrier 268) includes a housing 701 to which an HH device (e.g., device 702) may be mounted by conventional means (e.g., screws 705 mounted to the disk drive 702 through oppositely facing sides 711, 713 of the housing 701). Carrier 268 also comprises a conventional lock handle 700. The housing 701 includes four legs (each of which is denoted by numeral 709); respective pairs of the legs 709 are positioned on sides 711, 713, respectively, of the housing 701. A rubber-like, resilient shock-absorbing material is disposed around each of the legs 709 and projects beyond the sides of the housing 701; this rubber-like material acts to dampen coupling to the chassis 202 of vibration generated by the disk drive 702 during operation of the disk drive 702, and thereby also acts to reduce the coupling, through the chassis 202 to other disk drives mounted in the chassis 202, of such vibration. A flexible ribbon-type, or strap-like, electrical cable (not shown) may be used to electrically and mechanically connect the cable's connector plug 707 to a conventional electromechanical connector 708 comprised in the housing 701; the plug 707 may be electrically and mechanically mated to the disk drive's connector plug 715. Additional techniques may also be used to further reduce coupling of vibration generated by the drive 702 through the chassis 202, e.g., techniques of the type disclosed in co-pending U.S. patent application Ser. No. 09/473,668, entitled "Fibre Channel Data Storage System," filed Dec. 29, 1999, which co-pending Application is hereby incorporated herein by reference its entirety.

Housing 701 also includes eight projections or members (each of which is denoted by numeral 706) that extend from surfaces 711, 713. More specifically, four respective projections 706 extend from surface 711, and four respective projections 706 extend from surface 713. Each projection 706 has a respective substantially trapezoidal longitudinal cross-section.

Figure 11:
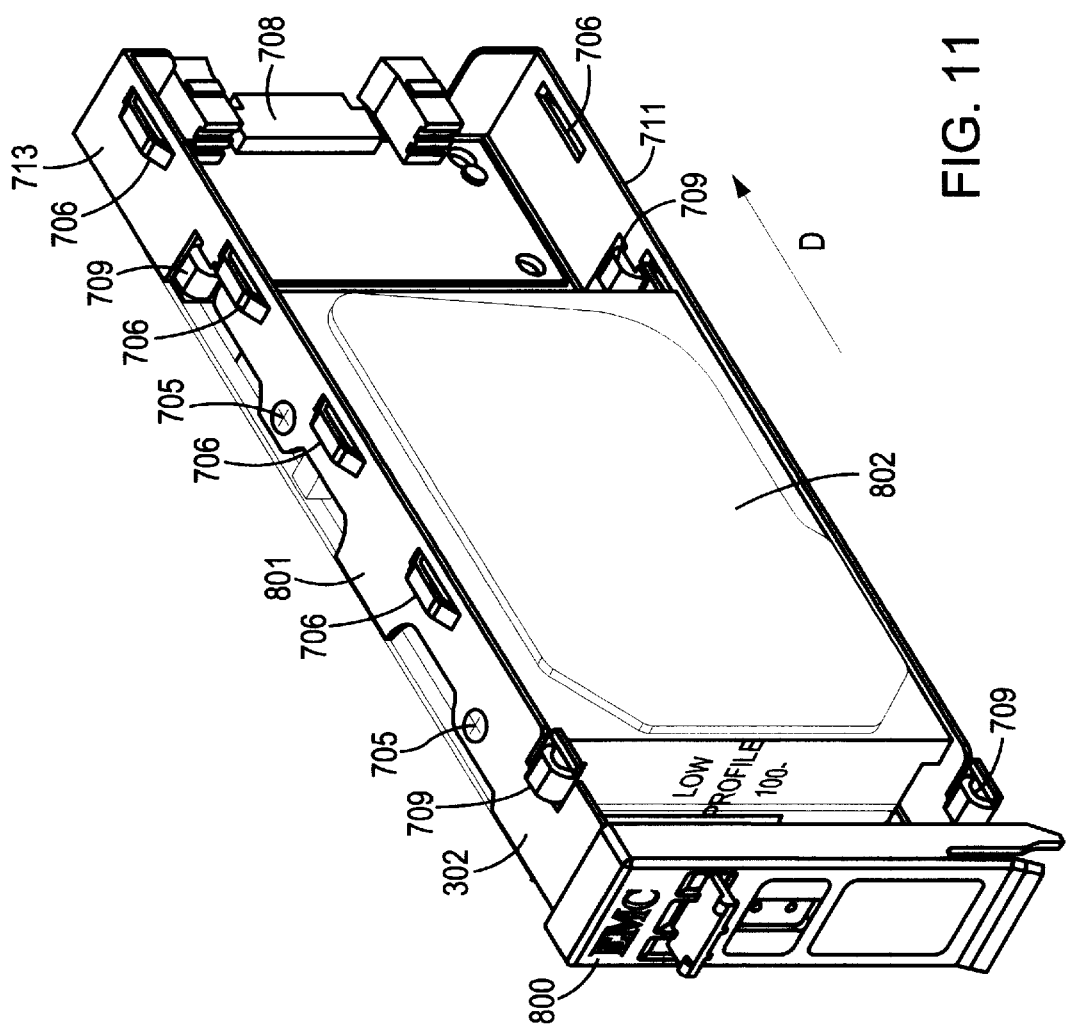
FIG. 11 is a front isometric view of a housing or carrier device that may be used in the chassis/cabinet of FIG. 4, which carrier device is shown attached to and partially enclosing an LP device (i.e., a low profile disk drive unit).
Figure 12:
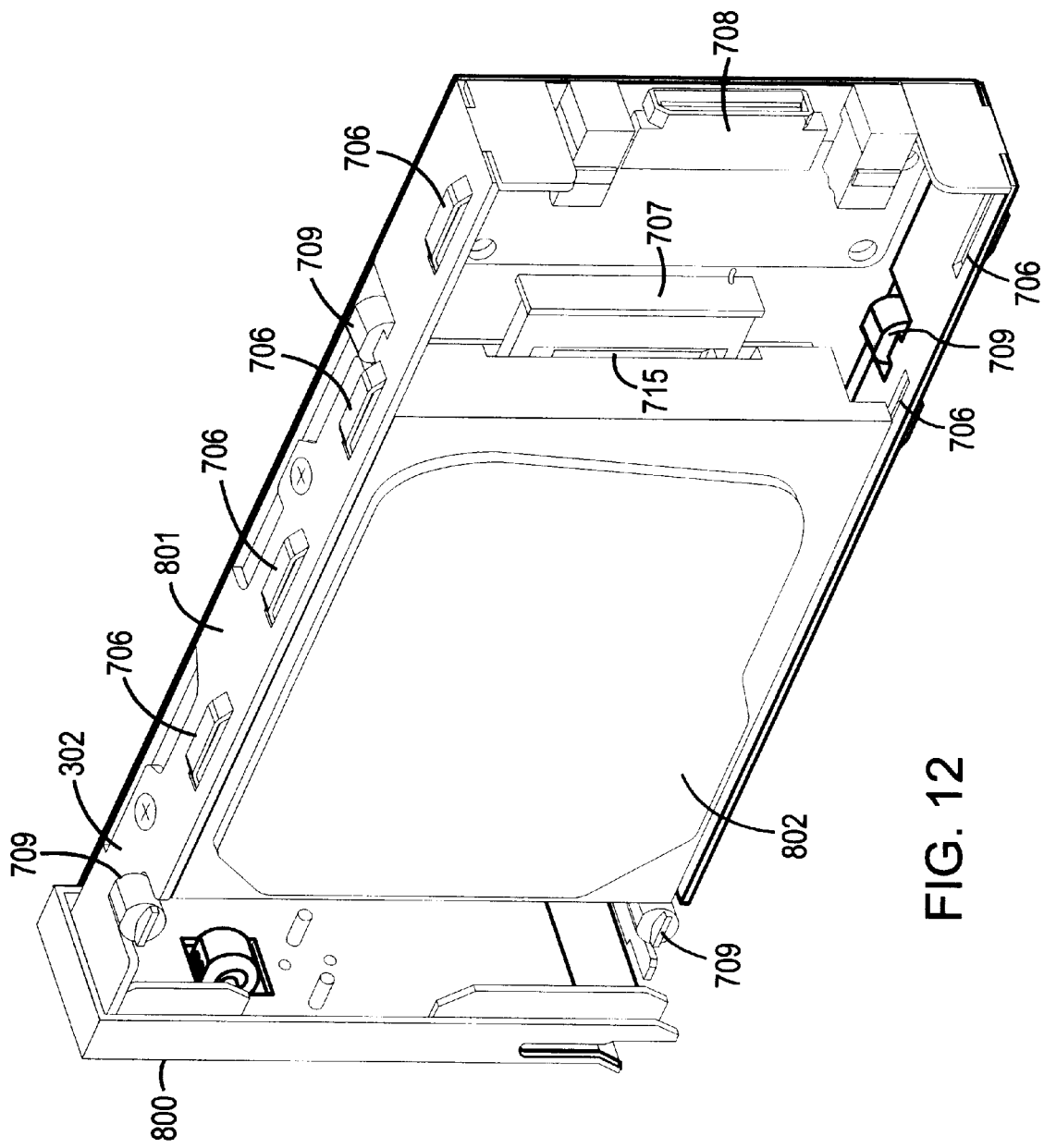
FIG. 12 is a side elevational view of the housing of FIG. 11.

As shown in FIGS. 11–12, an LP carrier (e.g., LP carrier 302) includes a housing 801 to which an LP device (e.g., device 802) may be mounted by conventional means (e.g., screws 705 mounted to the disk drive 802 through oppositely facing sides 711, 713 of the housing 801). Carrier 302 also comprises a conventional lock handle 800. The housing 801 includes four legs (each of which is denoted by numeral 709); respective pairs of the legs 709 are positioned on sides 711, 713, respectively, of the housing 801. A rubber-like, resilient shock-absorbing material is disposed around each of the legs 709 and projects beyond the sides of the housing 801; this rubber-like material acts to dampen coupling to the chassis 202 of vibration generated by the disk drive 802 during operation of the disk drive 802, and thereby also acts to reduce the coupling, through the chassis 202 to other disk drives mounted in the chassis 202, of such vibration. A flexible ribbon-type, or strap-like, electrical cable (not shown) may be used to electrically and mechanically connect the cable's connector plug 707 to a conventional electromechanical connector 708 comprised in the housing 801; the plug 707 may be electrically and mechanically mated to the disk drive's connector plug 715. Additional techniques may also be used to further reduce coupling of vibration generated by the drive 802 through the chassis 202, e.g., techniques of the type disclosed in co-pending U.S. patent application Ser. No. 09/473,668, entitled "Fibre Channel Data Storage System," filed Dec. 29, 1999.

Housing 801 also includes eight projections or members (each of which projections is denoted by numeral 706) that extend from surfaces 711, 713. More specifically, four respective projections 706 that extend from surface 711, and four respective projections 706 extend from surface 713. Each projection 706 has a respective substantially trapezoidal longitudinal cross-section.

With reference now being made to FIGS. 4–6 and 13, with the exception of the top surfaces of the top racks 258, 266 and the bottom surfaces of the bottom racks 252, 260 in chassis 202, each respective track in the top surface of a respective rack may be grouped or associated (e.g., in a respective set or group) with a respective nearest opposing track in the bottom surface of another rack positioned directly above it. For example, track 400 in the top surface 423 of bottom rack 252 may be associated, in a respective set or group, with the opposing track 900 closest to it in the bottom surface of middle rack 254. Track 402 in the top surface 423 of bottom rack 252 may be associated, in a respective set or group, with the opposing track 902 closest to it in the bottom surface of middle rack 254. Track 404 in the top surface 423 of bottom rack 252 may be associated, in a respective set or group, with the opposing track 904 closest to it in the bottom surface of middle rack 254. Track 406 in the top surface 423 of bottom rack 252 may be associated, in a respective set or group, with the opposing track 906 closest to it in the bottom surface of middle rack 254. Track 408 in the top surface 423 of bottom rack 252 may be associated, in a respective set or group, with the opposing track 908 closest to it in the bottom surface of middle rack 254. Track 410 in the top surface 423 of bottom rack 252 may be associated, in a respective set or group, with the opposing track 910 closest to it in the bottom surface of middle rack 254. Track 412 in the top surface 423 of bottom rack 252 may be associated, in a respective set or group, with the opposing track 912 closest to it in the bottom surface of middle rack 254. Track 414 in the top surface 423 of bottom rack 252 may be associated, in a respective set or group, with the opposing track 914 closest to it in the bottom surface of middle rack 254.

Similarly, track 400 in the top surface of middle rack 254 may be associated, in a respective set or group, with the opposing track 900 closest to it in the bottom surface of middle rack 256. Track 402 in the top surface of rack 254 may be associated, in a respective set or group, with the opposing track 902 closest to it in the bottom surface of middle rack 256. Track 404 in the top surface of rack 254 may be associated, in a respective set or group, with the opposing track 904 closest to it in the bottom surface of middle rack 256. Track 406 in the top surface of rack 254 may be associated, in a respective set or group, with the opposing track 906 closest to it in the bottom surface of middle rack 256. Track 408 in the top surface of rack 254 may be associated, in a respective set or group, with the opposing track 908 closest to it in the bottom surface of middle rack 256. Track 410 in the top surface of rack 254 may be associated, in a respective set or group, with the opposing track 910 closest to it in the bottom surface of middle rack 256. Track 412 in the top surface of rack 254 may be associated, in a respective set or group, with the opposing track 912 closest to it in the bottom surface of middle rack 256. Track 414 in the top surface of rack 254 may be associated, in a respective set or group, with the opposing track 914 closest to it in the bottom surface of middle rack 256.

Track 400 in the top surface of middle rack 256 may be associated, in a respective set or group, with the opposing track 900 closest to it in the bottom surface of top rack 258. Track 402 in the top surface of rack 256 may be associated, in a respective set or group, with the opposing track 902 closest to it in the bottom surface of rack 258. Track 404 in the top surface of rack 256 may be associated, in a respective set or group, with the opposing track 904 closest to it in the bottom surface of rack 258. Track 406 in the top surface of rack 256 may be associated, in a respective set or group, with the opposing track 906 closest to it in the bottom surface of rack 258. Track 408 in the top surface of rack 256 may be associated, in a respective set or group, with the opposing track 908 closest to it in the bottom surface of rack 258. Track 410 in the top surface of rack 256 may be associated, in a respective set or group, with the opposing track 910 closest to it in the bottom surface of rack 258. Track 412 in the top surface of rack 256 may be associated, in a respective set or group, with the opposing track 912 closest to it in the bottom surface of rack 258. Track 414 in the top surface of rack 256 may be associated, in a respective set or group, with the opposing track 914 closest to it in the bottom surface of rack 258.

Track 400 in the top surface of bottom rack 260 may be associated, in a respective set or group, with the opposing track 900 closest to it in the bottom surface of middle rack 262. Track 402 in the top surface of bottom rack 260 may be associated, in a respective set or group, with the opposing track 902 closest to it in the bottom surface of middle rack 262. Track 404 in the top surface of bottom rack 260 may be associated, in a respective set or group, with the opposing track 904 closest to it in the bottom surface of middle rack 262. Track 406 in the top surface of bottom rack 260 may be associated, in a respective set or group, with the opposing track 906 closest to it in the bottom surface of middle rack 262. Track 408 in the top surface of bottom rack 260 may be associated, in a respective set or group, with the opposing track 908 closest to it in the bottom surface of middle rack 262. Track 410 in the top surface of bottom rack 260 may be associated, in a respective set or group, with the opposing track 910 closest to it in the bottom surface of middle rack 262. Track 412 in the top surface of bottom rack 260 may be associated, in a respective set or group, with the opposing track 912 closest to it in the bottom surface of middle rack 262. Track 414 in the top surface of bottom rack 260 may be associated, in a respective set or group, with the opposing track 914 closest to it in the bottom surface of middle rack 262.

Track 400 in the top surface of middle rack 262 may be associated, in a respective set or group, with the opposing track 900 closest to it in the bottom surface of middle rack 264. Track 402 in the top surface of rack 262 may be associated, in a respective set or group, with the opposing track 902 closest to it in the bottom surface of middle rack 264. Track 404 in the top surface of rack 262 may be associated, in a respective set or group, with the opposing track 904 closest to it in the bottom surface of middle rack 264. Track 406 in the top surface of rack 262 may be associated, in a respective set or group, with the opposing track 906 closest to it in the bottom surface of middle rack 264. Track 408 in the top surface of rack 262 may be associated, in a respective set or group, with the opposing track 908 closest to it in the bottom surface of middle rack 264. Track 410 in the top surface of rack 262 may be associated, in a respective set or group, with the opposing track 910 closest to it in the bottom surface of middle rack 264. Track 412 in the top surface of rack 262 may be associated, in a respective set or group, with the opposing track 912 closest to it in the bottom surface of middle rack 264. Track 414 in the top surface of rack 262 may be associated, in a respective set or group, with the opposing track 914 closest to it in the bottom surface of middle rack 264.

Track 400 in the top surface of middle rack 264 may be associated, in a respective set or group, with the opposing track 900 closest to it in the bottom surface of top rack 266. Track 402 in the top surface of rack 264 may be associated, in a respective set or group, with the opposing track 902 closest to it in the bottom surface of rack 266. Track 404 in the top surface of rack 264 may be associated, in a respective set or group, with the opposing track 904 closest to it in the bottom surface of rack 266. Track 406 in the top surface of rack 264 may be associated, in a respective set or group, with the opposing track 906 closest to it in the bottom surface of rack 266. Track 408 in the top surface of rack 264 may be associated, in a respective set or group, with the opposing track 908 closest to it in the bottom surface of rack 266. Track 410 in the top surface of rack 264 may be associated, in a respective set or group, with the opposing track 910 closest to it in the bottom surface of rack 266. Track 412 in the top surface of rack 264 may be associated, in a respective set or group, with the opposing track 912 closest to it in the bottom surface of rack 266. Track 414 in the top surface of rack 264 may be associated, in a respective set or group, with the opposing track 914 closest to it in the bottom surface of rack 266.

The set of tracks consisting of tracks 400, 900 in racks 256, 258, respectively, may be associated with connector 500, and may be located in the region 600. The set of tracks consisting of tracks 402, 902 in racks 256, 258, respectively, may be associated with connector 502, and may be located in the region 600. The set of tracks consisting of tracks 404, 904 in racks 256, 258, respectively, may be associated with connector 504, and may be located in the region 600. The set of tracks consisting of tracks 406, 906 in racks 256, 258, respectively, may be associated with connector 506, and may be located in the region 600. The set of tracks consisting of tracks 408, 908 in racks 256, 258, respectively, may be associated with connector 508, and may be located in the region 602. The set of tracks consisting of tracks 410, 910 in racks 256, 258, respectively, may be associated with connector 510, and may be located in the region 602. The set of tracks consisting of tracks 412, 912 in racks 256, 258, respectively, may be associated with connector 512, and may be located in the region 602. The set of tracks consisting of tracks 414, 914 in racks 256, 258, respectively, may be associated with connector 514, and may be located in the region 602.

The set of tracks consisting of tracks 400, 900 in racks 254, 256, respectively, may be associated with connector 516, and may be located in the region 604. The set of tracks consisting of tracks 402, 902 in racks 254, 256, respectively, may be associated with connector 518, and may be located in the region 604. The set of tracks consisting of tracks 404, 904 in racks 254, 256, respectively, may be associated with connector 520, and may be located in the region 604. The set of tracks consisting of tracks 406, 906 in racks 254, 256, respectively, may be associated with connector 522, and may be located in the region 604. The set of tracks consisting of tracks 408, 908 in racks 254, 256, respectively, may be associated with connector 524, and may be located in the region 606. The set of tracks consisting of tracks 410, 910 in racks 254, 256, respectively, may be associated with connector 526, and may be located in the region 606. The set of tracks consisting of tracks 412, 912 in racks 254, 256, respectively, may be associated with connector 528, and may be located in the region 606. The set of tracks consisting of tracks 414, 914 in racks 254, 256, respectively, may be associated with connector 530, and may be located in the region 606.

The set of tracks consisting of tracks 400, 900 in racks 252, 254, respectively, may be associated with connector 532, and may be located in the region 608. The set of tracks consisting of tracks 402, 902 in racks 252, 254, respectively, may be associated with connector 534, and may be located in the region 608. The set of tracks consisting of tracks 404, 904 in racks 252, 254, respectively, may be associated with connector 536, and may be located in the region 608. The set of tracks consisting of tracks 406, 906 in racks 252, 254, respectively, may be associated with connector 538, and may be located in the region 608. The set of tracks consisting of tracks 408, 908 in racks 252, 254, respectively, may be associated with connector 540, and may be located in the region 610. The set of tracks consisting of tracks 410, 910 in racks 252, 254, respectively, may be associated with connector 542, and may be located in the region 610. The set of tracks consisting of tracks 412, 912 in racks 252, 254, respectively, may be associated with connector 544, and may be located in the region 610. The set of tracks consisting of tracks 414, 914 in racks 252, 254, respectively, may be associated with connector 546, and may be located in the region 610.

The set of tracks consisting of tracks 400, 900 in racks 264, 266, respectively, may be associated with connector 548, and may be located in the region 612. The set of tracks consisting of tracks 402, 902 in racks 264, 266, respectively, may be associated with connector 550, and may be located in the region 612. The set of tracks consisting of tracks 404, 904 in racks 264, 266, respectively, may be associated with connector 552, and may be located in the region 612. The set of tracks consisting of tracks 406, 906 in racks 264, 266, respectively, may be associated with connector 554, and may be located in the region 612. The set of tracks consisting of tracks 408, 908 in racks 264, 266, respectively, may be associated with connector 556, and may be located in the region 614. The set of tracks consisting of tracks 410, 910 in racks 264, 266, respectively, may be associated with connector 558, and may be located in the region 614. The set of tracks consisting of tracks 412, 912 in racks 264, 266, respectively, may be associated with connector 560, and may be located in the region 614. The set of tracks consisting of tracks 414, 914 in racks 264, 266, respectively, may be associated with connector 562, and may be located in the region 614.

The set of tracks consisting of tracks 400, 900 in racks 262, 264, respectively, may be associated with connector 564, and may be located in the region 616. The set of tracks consisting of tracks 402, 902 in racks 262, 264, respectively, may be associated with connector 566, and may be located in the region 616. The set of tracks consisting of tracks 404, 904 in racks 262, 264, respectively, may be associated with connector 568, and may be located in the region 616. The set of tracks consisting of tracks 406, 906 in racks 262, 264, respectively, may be associated with connector 570, and may be located in the region 616. The set of tracks consisting of tracks 408, 908 in racks 262, 264, respectively, may be associated with connector 572, and may be located in the region 618. The set of tracks consisting of tracks 410, 910 in racks 262, 264, respectively, may be associated with connector 574, and may be located in the region 618. The set of tracks consisting of tracks 412, 912 in racks 262, 264, respectively, may be associated with connector 576, and may be located in the region 618. The set of tracks consisting of tracks 414, 914 in racks 262, 264, respectively, may be associated with connector 578, and may be located in the region 618.

The set of tracks consisting of tracks 400, 900 in racks 260, 262, respectively, may be associated with connector 580, and may be located in the region 620. The set of tracks consisting of tracks 402, 902 in racks 260, 262, respectively, may be associated with connector 582, and may be located in the region 620. The set of tracks consisting of tracks 404, 904 in racks 260, 262, respectively, may be associated with connector 584, and may be located in the region 620. The set of tracks consisting of tracks 406, 906 in racks 260, 262, respectively, may be associated with connector 586, and may be located in the region 620. The set of tracks consisting of tracks 408, 908 in racks 260, 262, respectively, may be associated with connector 588, and may be located in the region 622. The set of tracks consisting of tracks 410, 910 in racks 260, 262, respectively, may be associated with connector 590, and may be located in the region 622. The set of tracks consisting of tracks 412, 912 in racks 260, 262, respectively, may be associated with connector 592, and may be located in the region 622. The set of tracks consisting of tracks 414, 914 in racks 260, 262, respectively, may be associated with connector 594, and may be located in the region 622.

The respective sets of tracks and their respective associated connectors in each of the respective regions 600, 602, 604, 606, 608, 610, 612, 614, 616, 618, 620, 622, and HH and LP carriers 268, 302 are constructed and dimensioned in such a way as to permit HH carrier 268 and LP carrier 302 to be inserted in and mounted to the chassis 202. More specifically, the carriers 268, 302 and the respective sets of tracks and respective associated connectors in each of the regions 600, 602, 604, 606, 608, 610, 612, 614, 616, 618, 620, 622 are constructed and dimensioned such that a predetermined number of the same type of carrier (i.e., either HH carrier 268 or LP carrier 302) may be inserted and mounted in a respective one (e.g., region 600) of the regions, and if the use of space in the region 600 is to be optimized, only carriers of the same respective type may be contemporaneously inserted and mounted in that respective region 600. However, different types of carriers may be inserted and mounted in different respective regions (e.g., regions 600 and 602). Thus, for example, one such region (e.g., region 600) may receive and store a respective subset of the mass storage devices in chassis 202, which subset may comprise two HH carriers (e.g., carriers 268 and 270), and another region (e.g., region 602) may contemporaneously receive and store another respective subset of the mass storage devices in chassis 202, which subset may comprise three LP carriers (e.g., carriers 308, 310, 312). Thus, since, when system 112 is in use, each of the HH carriers 268, is 270 houses a respective HH device (e.g., of the type of HH device 702 in FIG. 8), and each of the LP carriers 308, 310, 312 houses a respective LP device (e.g., of the type of LP device 802 in FIG. 9), the chassis 202 may contemporaneously receive and mount combinations of both HH and LP devices.

In each of the regions 600, 602, 604, 606, 608, 610, 612, 614, 616, 618, 620, 622, the construction and dimensioning of the respective sets of tracks and the respective associated connectors contained therein are respectively identical. Thus, in order to avoid unnecessary duplication of description, the construction and dimensioning of the sets of tracks and associated connectors in a single such region (e.g., region 600) will be described below.

With particular reference being made to FIGS. 8–13, in region 600, the first set of tracks (i.e., as viewed from left to right in FIG. 13) consists of tracks 400, 900 and is associated with connector 500 in the back plane 322. This first set of tracks and associated connector 500 are constructed and dimensioned to receive and mount either an HH device carrier (i.e., a carrier constructed identically to carrier 268) or an LP device carrier (i.e., a carrier constructed identically to carrier 302). That is, the first set of tracks and the carriers 268, 302 are dimensioned and constructed such that, when either of the carriers 268, 302 is appropriately oriented and inserted into the region 600 in an insertion direction D, the feet 709 and projections 706 of that carrier (see FIGS. 8–12) may be received in and engaged by the tracks 400, 900. When the feet 709 and projections 706 of that carrier 268 or 302 are so received in and engaged by tracks 400, 900, the carrier 268 or 302 may be guided by and/or slid along the tracks 400, 900 (when suitable force is applied to the carrier) such that the respective connector 708 of the carrier 268, 302 may be brought into registration with the respective connector 500 that is associated with the first set of tracks. When the connector 708 of the carrier 268 or 302 is so registered with the connector 500, appropriate force may be applied to the carrier 268 or 302 to cause connector 500 to electrically and mechanically mate with the connector 708 of the carrier 268 or 302, and thereby mount the carrier 268 or 302 in and to the chassis 202.

The HH and LP carriers, and the tracks and connectors in the region 600 are constructed and dimensioned such that, when one HH carrier 268 is already mounted to the chassis 202 in region 600, if the use of space in the region 600 is to be optimized, only another HH carrier 270 may be mounted in region 600. In region 600, the feet 709 and projections 706 of this second HH carrier 270 may be received and engaged by the third set of tracks (i.e., the set of tracks consisting of tracks 404, 904) and the connector 708 of carrier 270 may be coupled to the connector 504 associated with the third set of tracks. When the feet 709 and projections 706 of the second HH carrier 270 are received and engaged by the third set of tracks in region 600, the carrier 270 may be guided by and/or slid along the third set of tracks (when suitable force is applied to carrier 270) so as to bring the connector 708 of the carrier 270 into mating registration with the connector 504. Thereafter, by application of appropriate force, the connector 708 and connector 504 may be caused to electrically and mechanically mate with each other to mount the carrier 270 in the chassis 202. After two HH carriers 268, 270 have been. mounted in the region 600, no additional HH or LP carriers may be mounted in the region 600.

Conversely, the HH and LP carriers, and the tracks and connectors in the region 600 are constructed and dimensioned such that, when one LP carrier 302 is already mounted to the chassis 202 in region 600, if the use of space in the region 600 is to be optimized, only two additional LP carriers 304, 306 may be mounted in region 600. In region 600, the respective feet 709 and projections 706 of these second and third LP carriers 304, 306 may be received and engaged by the second and fourth sets of tracks (i.e., the sets of tracks consisting of tracks 402, 902 and 406, 906, respectively) and the respective connectors 708 of carriers 304, 306 may be coupled to the connectors 502, 506 that are respectively associated with the second and fourth sets of tracks. When the respective feet 709 and projections 706 of the second and third LP carriers 304, 306 are respectively received and engaged by the second and fourth sets of tracks in region 600, the carriers 304, 306 may be respectively guided by and/or slid along the second and fourth sets of tracks (when suitable forces are applied to carriers 304, 306) so as to bring the respective connectors 708 of the carriers 304, 306 into respective mating registrations with the connectors 502, 506. Thereafter, by application of appropriate respective forces, the respective connectors 708 of the carriers 304, 306 may be caused to electrically and mechanically mate with connectors 502, 506, respectively, to mount the carriers 304, 306 in the chassis 202. After three LP carriers 302, 304, 306 have been mounted in the region 600, no additional HH or LP carriers may be mounted in the region 600.

Thus, when the maximum number of HH carriers are mounted in the region 600, two connectors 502, 506 are not coupled to any carrier devices/disk mass storage devices in region 600. Therefore, when the maximum number of HH carriers are mounted in the chassis 202, twenty-four connectors 502, 506, 510, 514, 518, 522, 526, 530, 534, 538, 542, 546, 550, 554, 558, 562, 566, 570, 574, 578, 582, 586, 590, 594 are not coupled to any carrier devices/disk mass storage devices in the chassis 202.

Conversely, when the maximum number of LP carriers are mounted in the region 600, one connector 504 is not coupled to any carrier device/disk mass storage device in region 600. Thus, when the maximum number of LP carriers are mounted in the chassis 202, twelve connectors 504, 512, 520, 528, 536, 544, 552, 560, 568, 576, 584, 592 are not coupled to any carrier devices/disk mass storage devices in the chassis 202.

With particular reference now being made to FIGS. 2 and 13 to 20, the construction and operation of the configurable FC loop communication system 1000 will be described. As stated previously, the system 1000 includes two PBC cards 276, 278. Card 276 comprises the circuit 1002 shown in FIG. 14. Card 278 comprises the circuit 1004 shown in FIG. 15.

Figure 14:
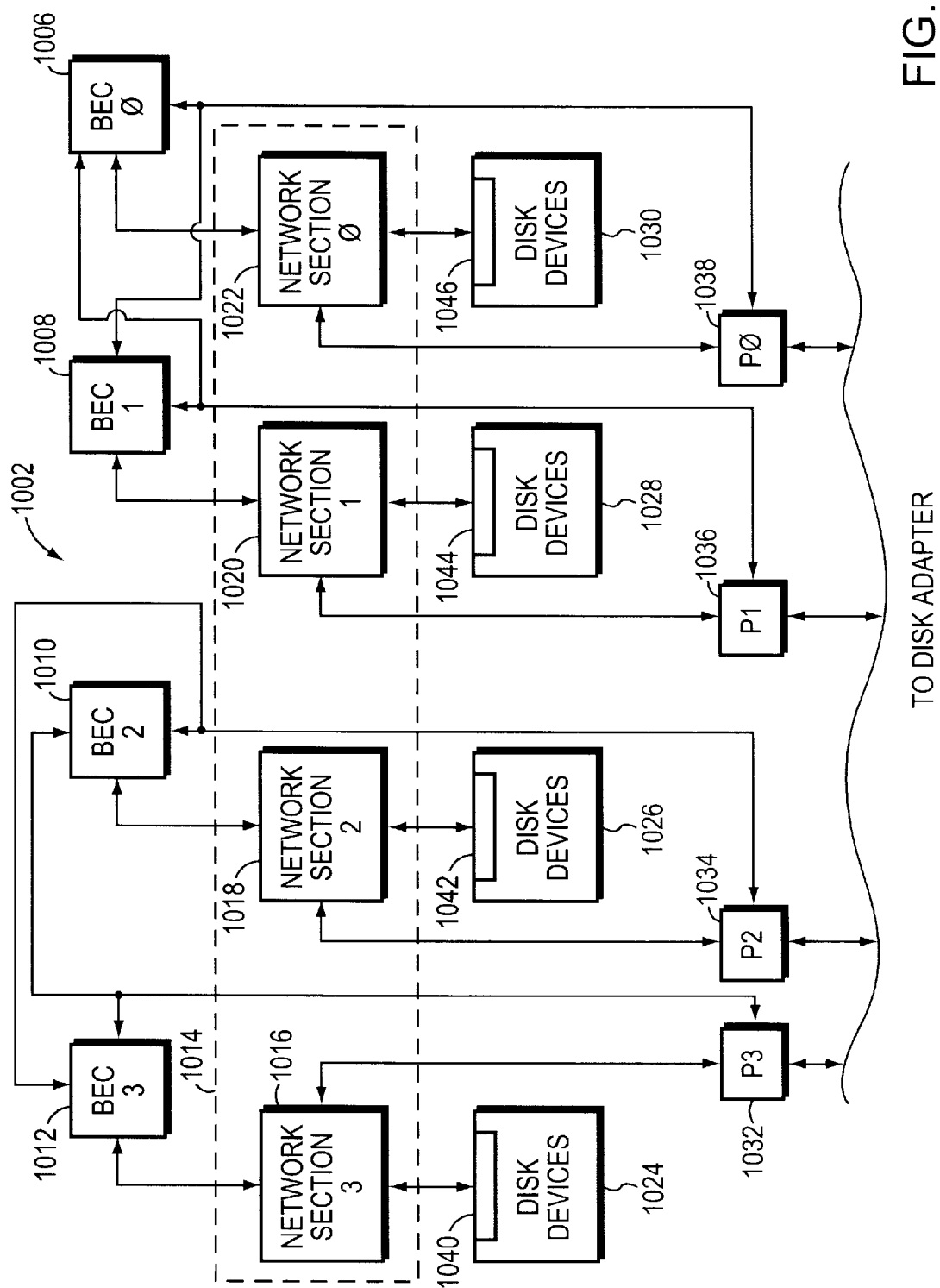
FIGS. 14 and 15 are highly schematic diagrams illustrating functional components of configurable port bypass cards that may be housed in the chassis of FIG. 4.

As shown in FIG. 14, circuit 1002 includes a configurable FC network 1014. Network 1014 includes configurable FC network sections 1016, 1018, 1020, and 1022. Sections 1016, 1018, 1020, 1022 are coupled to, and controlled by, bypass element controllers (hereinafter referred to in the singular or plural as "BEC") 1012, 1010, 1008, 1006, respectively. Each of the sections 1016, 1018, 1020, 1022 is also coupled to a respective subset 1024, 1026, 1028, 1030, of the disk mass storage devices in set 36. More specifically, each of the disk mass storage devices in system 112 may comprise two respective I/O ports (e.g., a respective "A" I/O port and a respective "B" I/O port). The A I/O ports (collectively referred to by numeral 1040) of the disk mass storage devices comprised in the subset 1024 may be coupled to the network section 1016. The A I/O ports (collectively referred to by numeral 1042) of the disk mass storage devices comprised in the subset 1026 may be coupled to the network section 1018. The A I/O ports (collectively referred to by the numeral 1044) of the disk mass storage devices comprised in the subset 1028 may be coupled to the network section 1020. The A I/O ports (collectively referred to by the numeral 1046) of the disk mass storage devices comprised in the subset 1030 may be coupled to the network section 1022.

The circuit 1002 also includes four external I/O ports 1032, 1034, 1036, 1038. Port 1032 may be coupled to network section 1016, BEC 1012, and BEC 1010 and BEC 1010. Port 1034 may be coupled to network section 1018, BEC 1010 and BEC 1012. Port 1036 may be coupled to network section 1020, BEC 1008, and BEC 1006. Port 1038 may be coupled to network section 1022, BEC 1006, and BEC 1008.

Figure 15:
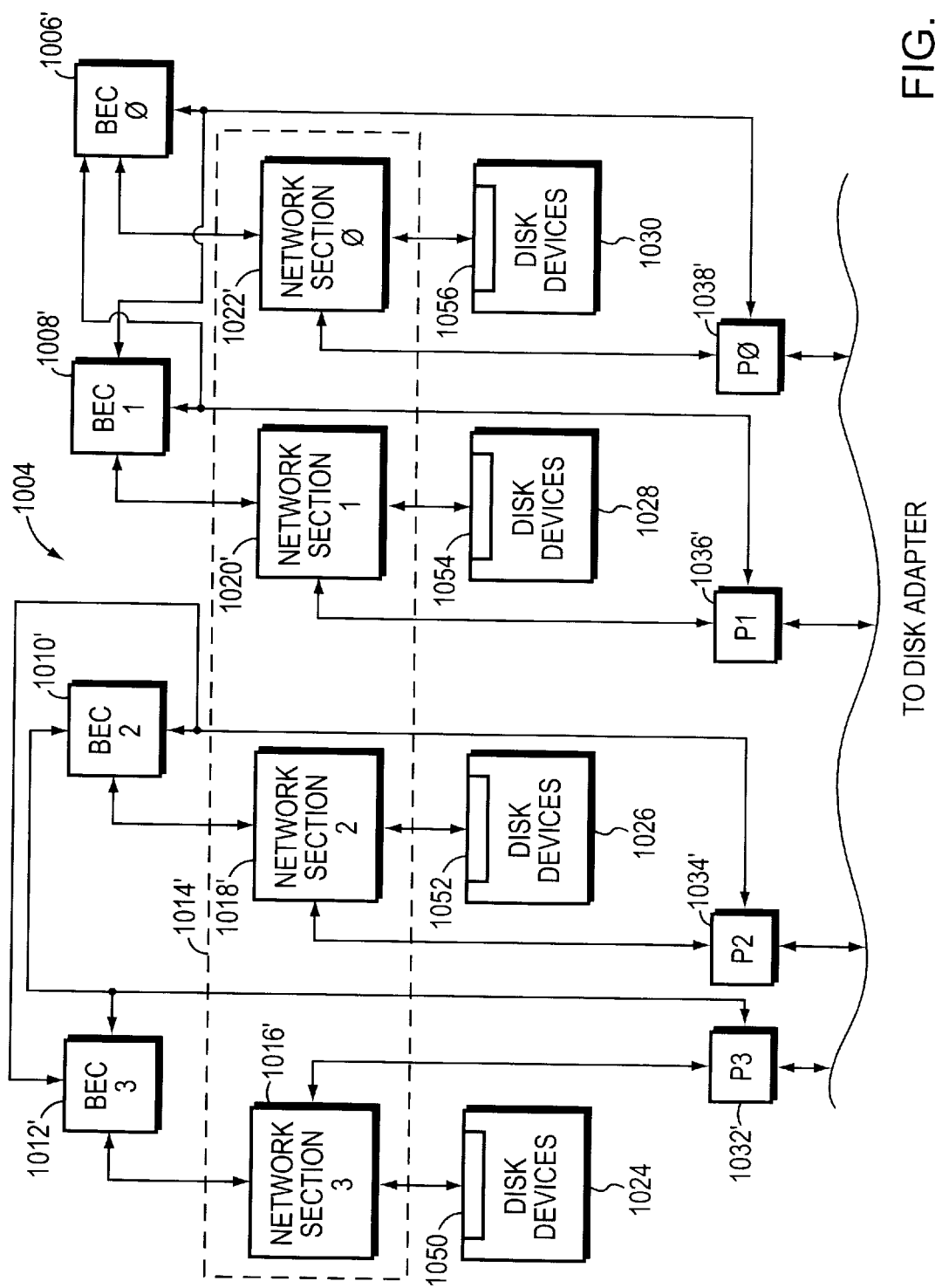
Figure 16:
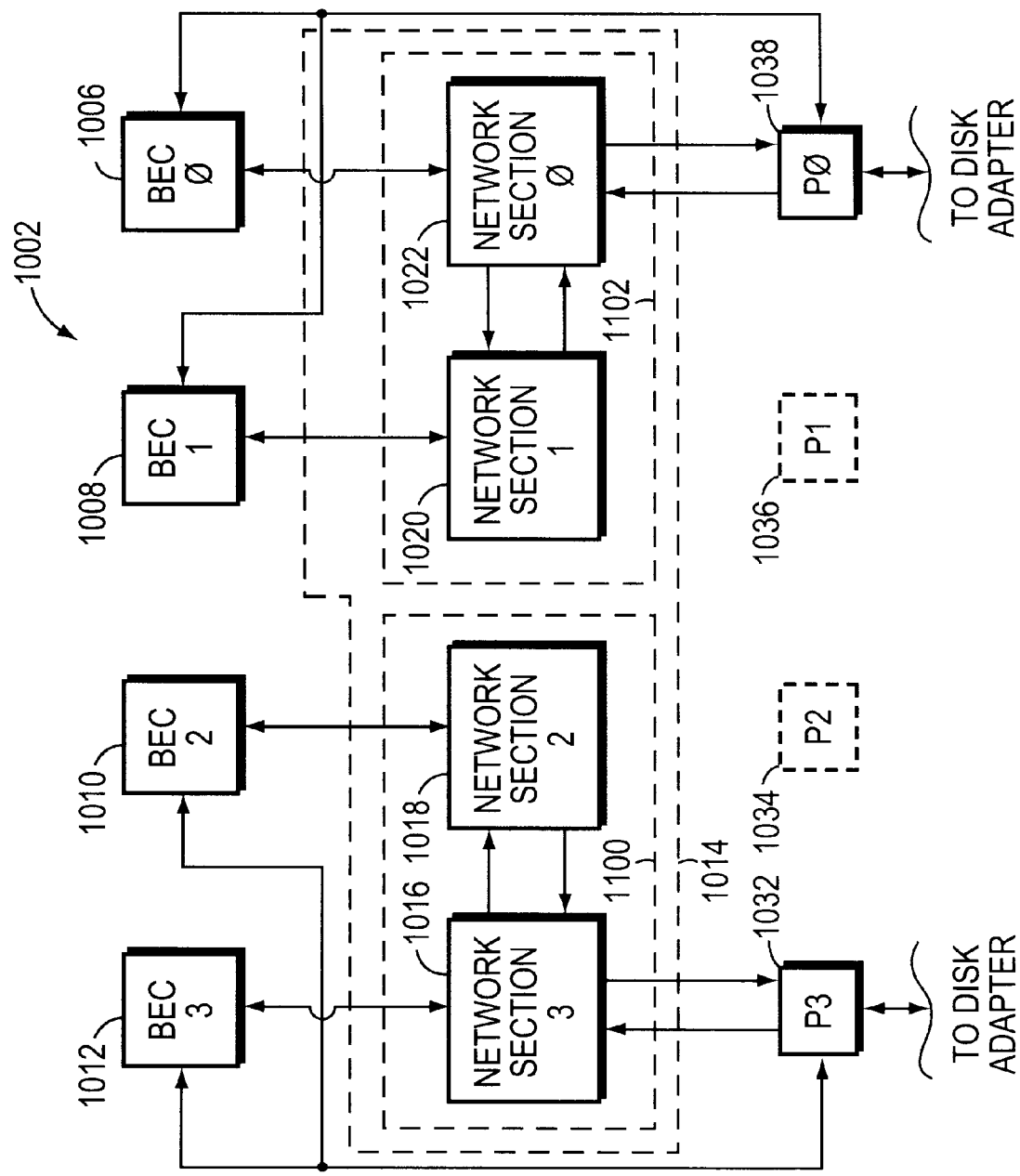
FIGS. 16 and 17 are highly schematic diagrams illustrating features of the port bypass cards of FIGS. 14 and 15 when the cards are operating in a certain operating mode/configuration.
Figure 17:
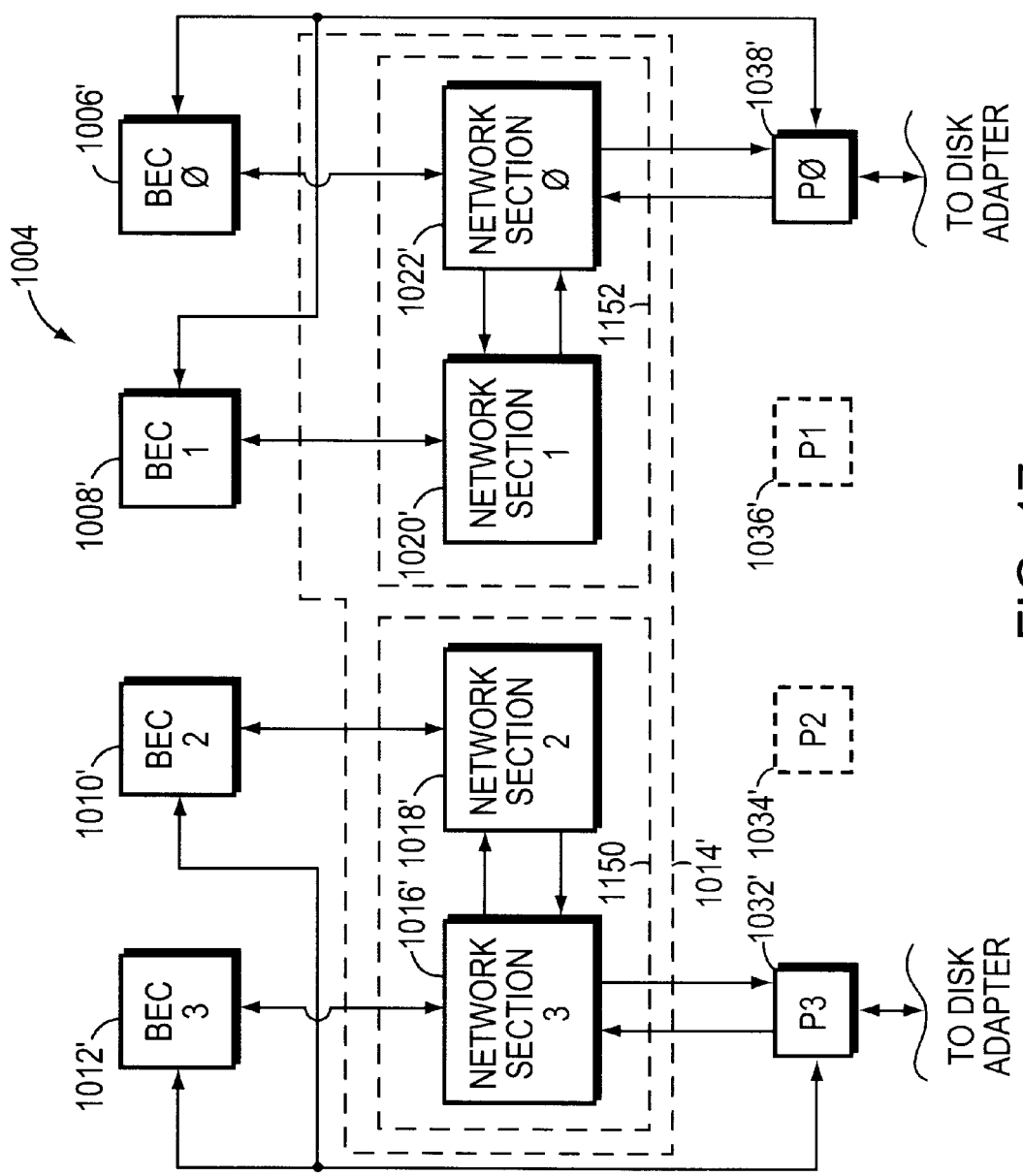

As shown in FIG. 15, circuit 1004 includes a configurable FC network 1014'. Network 1014' includes configurable FC network sections 1016', 1018', 1020', and 1022'. Each of the sections 1016', 1018', 1020', 1022' is coupled to, and is controlled by, a respective bypass element controller 1012', 1010', 1008', 1006', respectively. Sections 1016', 1018', 1020', 1022' are also coupled to the disk device subsets 1024, 1026, 1028, 1030, respectively. More specifically, the B I/O ports (collectively referred to by numeral 1050) of the disk mass storage devices comprised in the subset 1024 may be coupled to the network section 1016'. The B I/O ports (collectively referred to by numeral 1052) of the disk mass storage devices comprised in the subset 1026 may be coupled to the network section 1018'. The B I/O ports (collectively referred to by the numeral 1054) of the disk mass storage devices comprised in the subset 1028 may be coupled to the network section 1020'. The B I/O ports (collectively referred to by the numeral 1056) of the disk mass storage devices comprised in the subset 1030 may be coupled to the network section 1022'.

The circuit 1004 also includes four external I/O ports 1032', 1034', 1036', 1038'. Port 1032' may be coupled to network section 1016', BEC 1012', and BEC 1010'. Port 1034' may be coupled to network section 1018', BEC 1010' and BEC 1012'. Port 1036' may be coupled to network section 1020', BEC 1008' and BEC 1006'. Port 1038' may be coupled to network section 1022', BEC 1006' and BEC 1008'.

Depending upon the configuration of the system 112, each of the disk adapters 30A, 30B and the disk controllers 18A, 18B may comprise either four respective I/O ports, or alternatively, may comprise only two respective I/O ports). If the disk adapters 30A, 30B and disk controllers 18A, 18B each comprise four respective I/O ports, then the four I/O ports in the disk adapter 30B may be actively coupled to ports 1032, 1034, 1036, 1038, respectively. Conversely, if the disk adapters 30A, 30B and disk controllers 18A, 18B each comprise only two respective I/O ports, then the two I/O ports in the disk adapter 30B may be actively coupled to ports 1032 and 1038, respectively, and the other two ports 1034, 1036 in the circuit 1002 may not be actively coupled to any of the disk adapters in the system 112.

Similarly, if the disk adapters 30A, 30B and disk controllers 18A, 18B each comprise four respective I/O ports, then the four I/O ports in the disk adapter 30A maybe actively coupled to ports 1032', 1034', 1036', 1038', respectively. Conversely, if the disk adapters 30A, 30B and disk controllers 18A, 18B each comprise only two respective I/O ports, then the two I/O ports in the disk adapter 30A may be actively coupled to ports 1032' and 1038', respectively, and the other two ports 1034', 1036' in the circuit 1004 may not be actively coupled to any of the disk adapters in the system 112.

Each of the network sections 1016, 1018, 1020, 1022, 1016', 1018', 1020', 1022' may be of the same construction and may have the same operation. Thus, in order to avoid unnecessary duplication of description, the construction and operation of one (e.g., network 1016) of the network sections 1016, 1018, 1020, 1022, 1016', 1018', 1020', 1022' will be described herein.

Figure 18:
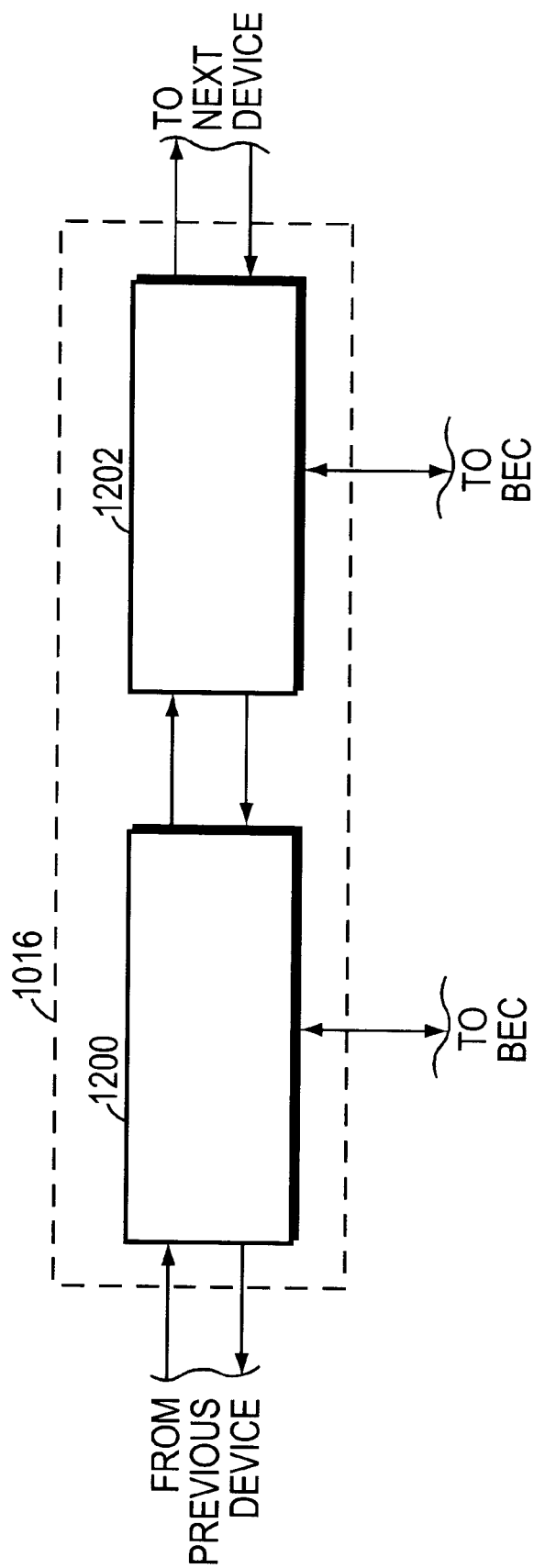
FIG. 18 is a highly schematic diagram illustrating functional components of one of the network sections comprised in the port bypass card of FIG. 14.
Figure 19:
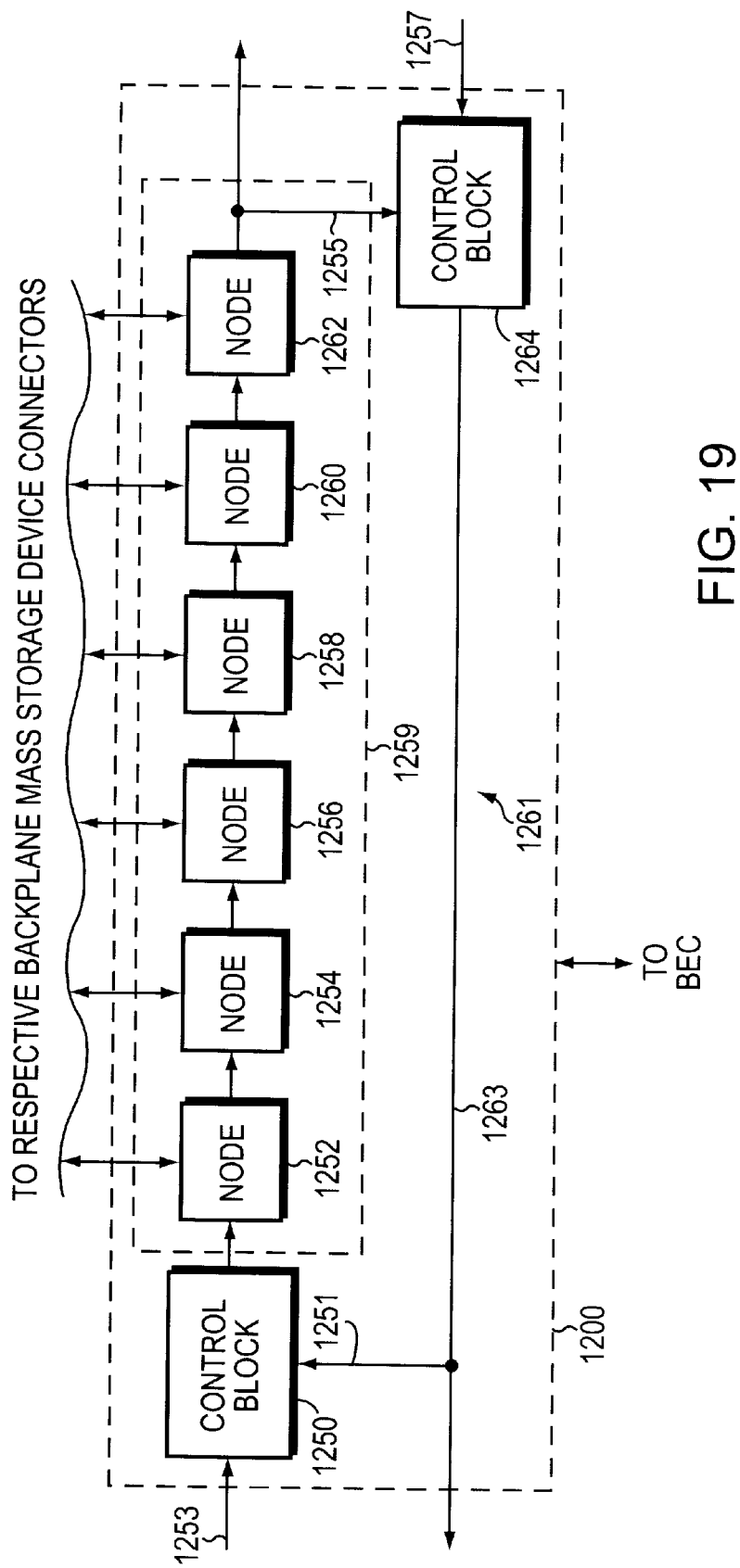
FIG. 19 is a highly schematic diagram illustrating relevant functional components of one of the FC port bypass circuits comprised in the network section of FIG. 18.
Figure 20:
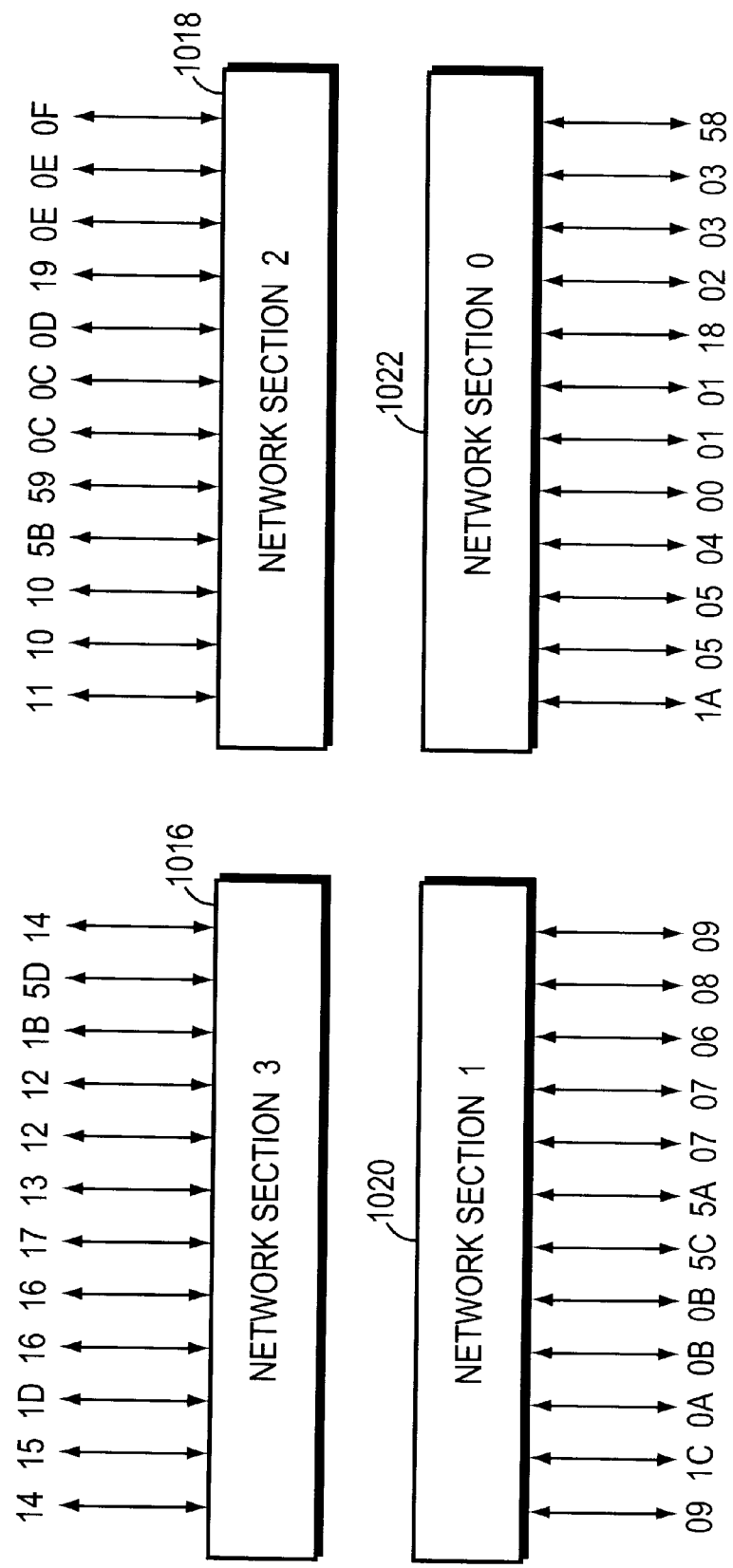
FIG. 20 is a highly schematic diagram illustrating the logical addresses that may be assigned to chassis back plane connectors connected to the network sections of the port bypass card of FIG. 14.

With reference being made to FIGS. 18 and 19, the construction and operation of network section 1016 will be described. Section 1016 includes two configurable FC loop circuits 1200, 1202 that are cascaded together. More specifically, each of the circuits 1200, 1202 may comprise a respective conventional VSC 7147 Hex FC Port Bypass Circuit that is commercially available from Vitesse Semiconductor Corporation of Camarillo, Calif., United States of America. Each respective FC loop circuit 1200, 1202 may be coupled to the respective BEC (e.g., BEC 1012 in the case of section 1016) that controls the respective network section that comprises the respective circuit 1200, 1202. Circuit 1200 may be coupled to a previous network device (i.e., the device that constitutes the last preceding network hop relative to the network section that comprises the circuit 1200); circuit 1202 may be coupled to a next network device (i.e., the device that may constitute the next network hop relative to the circuit 1202). For example, in the case of circuit 1200 in section 1016, the previous device is the port 1032. As will be described below, depending upon the configuration of the network 1014, in the case of circuit 1202 in section 1016, the next device may be either the network section 1018 or the circuit 1200.

Circuit 1200 comprises a FC loop network made up of a plurality of network nodes 1250, 1252, 1254, 1256, 1258, 1260, 1262, 1264. As will be described more fully below, two control block nodes in each of the FC loop circuits in each of the network sections comprise control logic that may be controlled by the BEC that controls the network section, so as to permit, among other things, the BEC to control the manner in which data flows through the FC loop circuits, and thereby to effectively control the configuration of network 1014. For example, the BEC 1012 that controls the section 1016 that comprises the circuit 1200 is able to control the block 1250 such that block 1250 may be caused either to propagate to node 1252 the signals at input 1253, or alternatively, to propagate to the node 1252 the signals at input 1251. Similarly, the BEC 1012 that controls the section 1016 that comprises the circuit 1200 is also able to control the block 1264 such that block 1264 may be caused either to propagate to output 1263 the signals at input 1255, or alternatively, to propagate to the output 1263 the signals at input 1257.

Each node in a subset 1259 of the nodes 1250, 1252, 1254, 1256, 1258, 1260, 1262, 1264 in circuit 1200 is coupled via a respective FC link to a respective connector comprised in the back plane 322. Likewise, network nodes comprised in a respective subset (not shown) of identical size in circuit 1202 are respectively coupled to respective connectors comprised in the back plane 322. Thus, each of the network sections 1016, 1018, 1020, 1022, 1016', 1018', 1020', 1022' comprises two such respective subsets of network nodes, and each such respective subset includes six network nodes; thus, each of the network sections 1016, 1018, 1020, 1022, 1016', 1018', 1020', 1022' includes a total of twelve respective network nodes that are comprised in such subsets.

In chassis 202, the twelve network nodes that are comprised in such subsets in network section 1016 may be respectively connected to connectors 564, 566, 568, 570, 580, 582, 584, 586, 588, 590, 592, 594, and when respective mass storage devices are coupled to these connectors 564, 566, 568, 570, 580, 582, 584, 586, 588, 590, 592, 594, the devices may be assigned the logical addresses (in hexadecimal) 13, 12, 12, 1B, 17, 16, 16, 1D, 15, 14, 14, and 5D, respectively, of these connectors 564, 566, 568, 570, 580, 582, 584, 586, 588, 590, 592, 594. The twelve network nodes that are comprised in such subsets in network section 1018 may be respectively connected to connectors 548, 550, 552, 554, 556, 558, 560, 562, 572, 574, 576, 578, and when respective mass storage devices are coupled to these connectors 548, 550, 552, 554, 556, 558, 560, 562, 572, 574, 576, 578, the devices may be assigned the logical addresses (in hexadecimal) F, E, E, 19, D, C, C, 59, 11, 10, 10, and 5B, respectively, of these connectors 548, 550, 552, 554, 556, 558, 560, 562, 572, 574, 576, 578. The twelve network nodes that are comprised in such subsets in network section 1020 may be respectively connected to connectors 524, 526, 528, 530, 532, 534, 536, 538, 540, 542, 544, 546, and when respective mass storage devices are coupled to these connectors 524, 526, 528, 530, 532, 534, 536, 538, 540, 542, 544, 546, the devices may be assigned the logical addresses (in hexadecimal) 6, 7, 7, 5A, 8, 9, 9, 1C, A, B, B, and 5C, respectively, of these connectors 524, 526, 528, 530, 532, 534, 536, 538, 540, 542, 544, 546. The twelve network nodes that are comprised in such subsets in network section 1022 may be respectively connected to connectors 500, 502, 504, 506, 508, 510, 512, 514, 516, 518, 520, 522, and when respective mass storage devices are coupled to these connectors 500, 502, 504, 506, 508, 510, 512, 514, 516, 518, 520, 522, the devices may be assigned logical addresses (in hexadecimal) 0, 1, 1, 18, 2, 3, 3, 58, 4, 5, 5, and 1A, respectively, of these connectors 500, 502, 504, 506, 508, 510, 512, 514, 516, 518, 520, 522.

In chassis 202, the twelve network nodes that are comprised in such subsets in network section 1016' may be respectively connected to connectors 564, 566, 568, 570, 580, 582, 584, 586, 588, 590, 592, 594, and when respective mass storage devices are coupled to these connectors 564, 566, 568, 570, 580, 582, 584, 586, 588, 590, 592, 594, the devices may be assigned the logical addresses (in hexadecimal) 13, 12, 12, 1B, 17, 16, 16, 1D, 15, 14, 14, and 5D, respectively, of these connectors 564, 566, 568, 570, 580, 582, 584, 586, 588, 590, 592, 594. The twelve network nodes that are comprised in such subsets in network section 1018' may be respectively connected to connectors 548, 550, 552, 554, 556, 558, 560, 562, 572, 574, 576, 578, and when respective mass storage devices are coupled to these connectors 548, 550, 552, 554, 556, 558, 560, 562, 572, 574, 576, 578, the devices may be assigned logical addresses (in hexadecimal) F, E, E, 19, D, C, C, 59, 11, 10, 10, and 5B, respectively, of these connectors 548, 550, 552, 554, 556, 558, 560, 562, 572, 574, 576, 578. The twelve network nodes that are comprised in such subsets in network section 1020' may be respectively connected to connectors 524, 526, 528, 530, 532, 534, 536, 538, 540, 542, 544, 546, and when respective mass storage devices are coupled to these connectors 524, 526, 528, 530, 532, 534, 536, 538, 540, 542, 544, 546, the devices may be assigned the logical addresses (in hexadecimal) 6, 7, 7, 5A, 8, 9, 9, 1C, A, B, B, and 5C, respectively, of these connectors 524, 526, 528, 530, 532, 534, 536, 538, 540, 542, 544, 546. The twelve network nodes that are comprised in such subsets in network section 1022' may be respectively connected to connectors 500, 502, 504, 506, 508, 510, 512, 514, 516, 518, 520, 522, and when respective mass storage devices are coupled to these connectors 500, 502, 504, 506, 508, 510, 512, 514, 516, 518, 520, 522, the devices may be assigned the logical addresses (in hexadecimal) 0, 1, 1, 18, 2, 3, 3, 58, 4, 5, 5, and 1A, respectively, of these connectors 500, 502, 504, 506, 508, 510, 512, 514, 516, 518, 520, 522.

The connections made from these network nodes in network sections 1016, 1018, 1020, 1022 to the connectors 500, 502, 504, . . . 594 are such that, when mass storage devices are connected to the connectors 500, 502, 504, . . . 594, the A ports 1040, 1042, 1044, 1046 of the disk devices 1024, 1026, 1028, 1030 comprised in these mass storage devices become coupled to these network sections 1016, 1018, 1020, 1022, but the B ports 1050, 1052, 1054, 1056 of the disk devices 1024, 1026, 1028, 1030 do not become coupled to the sections 1016, 1018, 1020, 1022.

The connections made from these network nodes in network sections 1016', 1018', 1020', 1022' to the connectors 500, 502, 504, . . . 594 are such that, when mass storage devices are connected to the connectors 500, 502, 504, . . . 594, the B ports 1050, 1052, 1054, 1056 of the disk devices 1024, 1026, 1028, 1030 comprised in these mass storage devices become coupled to these network sections 1016', 1018', 1020', 1022', but the A ports 1040, 1042, 1044, 1046 of the disk devices 1024, 1026, 1028, 1030 do not become coupled to the sections 1016', 1018', 1020', 1022'.

The respective connectors 500, 502, 504, . . . 594 may be assigned different respective physical addresses that may be associated with the respective network nodes to which the connectors 500, 502, 504, . . . 594 are coupled. However, as can be seen from the above, certain pairs of adjacent connectors (i.e., connectors 502 and 504, connectors 510 and 512, connectors 518 and 520, connectors 526 and 528, connectors 534 and 536, connectors 542 and 544, connectors 550 and 552, connectors 558 and 560, connectors 566 and 568, connectors 574 and 576, connectors 582 and 584, and connectors 590 and 592) may be assigned the same respective logical addresses. Given the construction and operation of the chassis 202 described above, this situation can be permitted, since it is impossible for both of the connectors in a given one of these adjacent connector pairs to be contemporaneously connected to respective mass storage devices. For example, chassis 202 is designed such that connector 502 may be coupled to an LP device, and connector 504 may be coupled to an HH device. However, the design of chassis 202 is such that it is impossible to couple connector 504 to an HH device while connector 502 is contemporaneously coupled to an LP device. Thus, when it is desired to access mass storage devices mounted in the chassis 202 based upon the logical addresses of the connectors to which they are coupled, it is not expected that an actual logical address conflict will arise.

Hardwired connection links (not shown) are provided between the connectors 500, 502, . . . 594 and the BEC 1012, 1010, 1008, 1006, 1012', 1010', 1008', 1006'. If a disk mass storage device is coupled or decoupled from one of the connectors 500, 502, . . . 594, signals are provided via certain of the connection links to the respective BEC in the circuits 1002, 1004, respectively, that are responsible for controlling the network section to which the disk device is coupled. These signals may indicate the presence or absence of the disk device in the system 112, the storage size/type of the device (e.g., whether the device is an HH or LP device), the logical/physical address of the back plane connector to which the disk device is coupled, etc. Based upon these signals and information maintained by the respective BEC that correlates the logical/physical address of the back plane connectors with respective port numbers of the corresponding network nodes that may be coupled to those back plane connectors, the respective BEC may take appropriate action to control the configuration of the network section to which the respective BEC is coupled. For example, at power up of the system 112 or reset of the system 1000, the respective BEC may control multiplexer circuitry (not shown) in one of the network nodes so as to cause that network node to become coupled to a back plane connector (if a disk device has been coupled to the connector), or to decouple the node from the back plane connector (if the disk device has been decoupled from the connector) in such a way as to maintain continuity of the FC loop that comprises the network node. Conversely, if a disk device has been coupled to or decoupled from a back plane connector of chassis 202 after power up of system 112 or reset of the system 1000, the respective BEC may generate an interrupt requesting that the respective controller 18A or 18B that controls the respective BEC reset the system 1000. The respective BEC may report to the I/O controller responsible for controlling the respective BEC information identifying which back plane connectors and network nodes in the network sections in chassis 202 are coupled to active mass storage devices. The respective BEC may also maintain in one or more computer-readable memories (not shown, comprised e.g., in the back plane 322, the respective BEC, and/or elsewhere in the respective circuit 1002 comprising the respective BEC 1012) such information, as well as other information that identifies the respective types of disk devices (i.e., LP or HH devices) that may be coupled to the respective network nodes. The information contained in the one or more memories may be accessed by the respective I/O controller to which the respective BEC 1012 is coupled, and may be used by the respective I/O controller to determine the actual configuration (e.g., logical addresses of the back plane connectors to which the mass storage devices are coupled, all locations, physical addresses, respective storage sizes, etc.) of the mass storage devices mounted in the chassis 202.

If any network node (e.g., node 1254) is not coupled at power up of system 112 or reset of the circuits 1002, 1004 to an active mass storage device, the respective BEC (e.g., BEC 1012) that controls the respective network section 1016 that comprises the node 1254 may control multiplexer circuitry (not shown) comprised within that node 1254 so as to cause any data entering the node 1254 from the previous node (e.g., node 1252) in the loop (e.g., loop 1261) that comprises the node 1254 to be passed through the node 1254 to the next node (e.g., node 1256) in that loop 1261, thereby permitting the disk drive I/O port embodied by the node 1254 to be bypassed in the loop 1261 so as to ensure that the continuity of loop 1261 is maintained.

In operation of circuitry 1002, the BEC 1012, 1010, 1008, 1006 may detect (e.g., at power-up of the system 112 and/or reset of the circuit 1002) which ports 1032, 1034, 1036, 1038 are coupled to active (i.e., operational) I/O ports of adapter 30B. In this embodiment of system 112, if adapter 30B comprises only two such I/O ports, these two I/O ports of the adapter 30B are coupled to ports 1032 and 1038, respectively. Conversely, if the adapter 30B comprises four such I/O ports, these four I/O ports of the adapter 30B are coupled to ports 1032, 1034, 1036, 1038, respectively.

When the BEC 1012, 1010, 1008, 1006 detect that only ports 1032 and 1038 are coupled to active I/O ports of the adapter 30B, the BEC 1012, 1010, 1008, 1006 may configure the respective network sections 1016, 1018, 1020, 1022 such that the circuit 1002 operates in a respective first mode of operation. More specifically, in this first mode of operation, the BEC 1012 and 1010 control, among other things, the respective control blocks in network sections 1016 and 1018 such that the sections 1016 and 1018 together form a single FC loop 1100, with the disk devices 1024, 1026 comprising FC devices that may exchange data and commands with the disk I/O controller 18B, via the loop 1100, port 1032, and adapter 30B, using an FC arbitrated loop (AL) protocol. Also in this first mode of operation, the BEC 1008 and 1006 control, among other things, the respective control blocks in network sections 1020 and 1022 such that the sections 1020 and 1022 together form another FC loop 1102 that is separate from the loop 1100, with the disk devices 1028, 1030 comprising FC devices that may communicate with the disk I/O controller 18B, via the loop 1102, port 1038, and adapter 30B, using FC AL protocol. In this first mode of operation of circuit 1002, the ports 1034, 1036 are not coupled to any active device external to the circuit 1002, and therefore, are shown in ghost in FIG. 16.

Although not specifically shown in the Figures, each of the ports 1032, 1034, 1036, 1038 may include a respective conventional Inter-IC ("12C") protocol bus interface. In the first mode of operation of circuit 1002, the 12C interface in the port 1032 may be used to couple the BEC 1012 and 1010 to the adapter 30B via an 12C bus system (not shown), such that the BEC 1012 and 1010 may communicate with controller 18B using the bus system. Also, in the first mode of operation of the circuit 1002, the 12C interface in the port 1038 may be used to couple the BEC 1008 and 1006 to the adapter 30B via the 12C bus system, such that the BEC 1008 and 1006 also may communicate with controller 18B using the bus system. According to the 12C protocol, each BEC 1012, 1010, 1008, 1006 may act as a respective "slave" device, and the controller 18B may act as a respective "master" device.

In operation of circuitry 1004, the BEC 1012', 1010', 1008', 1006' may detect (e.g., at power-up of the system 112 and/or reset of the circuit 1004) which ports 1032', 1034', 1036', 1038' are coupled to active (i.e., operational) I/O ports of adapter 30A. In this embodiment of system 112, if adapter 30A comprises only two such I/O ports, these two I/O ports of the adapter 30A are coupled to ports 1032' and 1038', respectively. Conversely, if the adapter 30A comprises four such I/O ports, these four I/O ports of the adapter 30A are coupled to ports 1032', 1034', 1036', 1038', respectively.

When the BEC 1012', 1010', 1008', 1006' detect that only ports 1032' and 1038' are coupled to active I/O ports of the adapter 30A, the BEC 1012', 1010', 1008', 1006' may configure the respective network sections 1016', 1018', 1020', 1022' such that the circuit 1004 operates in a respective first mode of operation. More specifically, in this first mode of operation, the BEC 1012' and 1010' control, among other things, the respective control blocks in network sections 1016' and 1018' such that the sections 1016' and 1018' together form a single FC loop 1150, with the disk devices 1024, 1026 comprising FC devices that may exchange data and commands with the disk I/O controller 18A, via the loop 1150, port 1032', and adapter 30A, using FC AL protocol. Also in this first mode of operation, the BEC 1008' and 1006' control, among other things, the respective control blocks in network sections 1020' and 1022' such that the sections 1020' and 1022' together form another FC loop 1152 that is separate from the loop 1150, with the disk devices 1028, 1030 comprising FC devices that may communicate with the disk I/O controller 18A, via the loop 1152, port 1038', and adapter 30A, using FC arbitrated loop (AL) protocol. In this first mode of operation of circuit 1004, the ports 1034', 1036' are not coupled to any active device external to the circuit 1004, and therefore, are shown in ghost in FIG. 17.

Although not specifically shown in the Figures, each of the ports 1032', 1034', 1036', 1038' includes a respective conventional 12C bus interface. In the first mode of operation of circuit 1004, the 12C interface in the port 1032' may be used to couple the BEC 1012' and 1010' to the adapter 30A via an 12C bus system, such that the BEC 1012' and 1010' may communicate with controller 18A using the bus system. Also, in the first mode of operation of the circuit 1004, the 12C interface in the port 1038' may be used to couple the BEC 1008' and 1006' to the adapter 30A via the bus system, such that the BEC 1008' and 1006' also may communicate with controller 18A using the 12C bus system. According to the 12C protocol, each BEC 1012', 1010', 1008', 1006' may act as a respective "slave" device, and the controller 18A may act as a respective "master" device.

When the circuits 1002, 1004 are in their respective first modes of operation and are functioning normally, and the adapters 30A, 30B and controllers 18A, 18B are also functioning normally, loops 1102 and 1150 are active, and loops 1100 and 1152 are inactive. That is, when these conditions prevail, the loops 1100, 1102, 1150, 1152 are configured such that controller 18B may actively communicate with the disk devices in sets 1028, 1030 (via loop 1102), but controller 18B does not actively communicate with the disk devices in sets 1024, 1026 (via loop 1100), and conversely, controller 18A may actively communicate with the disk devices in sets 1024, 1026 (via loop 1150), but controller 18A does not actively communicate with the disk devices in sets 1028, 1030 (via loop 1152).

In system 112, one 1/O controller (e.g., controller 18A) in a redundant controller pair 18A, 18B may determine that the other I/O controller (e.g., controller 18B) and/or its associated adapter 18B in the redundancy pair 18A, 18B may have failed (i.e., is no longer functioning properly), if the other controller 18B does not issue within a predetermined period a signal (e.g., an interrupt request) that indicates that the controller 18B wishes to communicate with one or more of the other I/O controllers in the system 112. If while the circuits 1002, 1004 are in their first modes of operation, controller 18A determines that controller 18B or adapter 30B may have failed, the controller 18A may cause the circuit 1004 to initiate a failover processing with respect to circuit 1002 by which the controller 18B and adapter 30B will be completely decoupled from the disk devices in sets 1024, 1026, 1028, 1030. It should be understood, although not shown in the drawings, that BEC 1012, 1010, 1008, 1006 may be coupled together so as to permit communication among themselves. Likewise, the BEC 1012', 1010', 1008', 1006' may be coupled together so as to permit communication among themselves. When the circuit 1004 initiates the failover processing, a predetermined sequence of commands may be exchanged between the BEC 1006 and BEC 1006' via a control bus (not shown) between the circuits 1002, 1004. Proper execution of the sequence of commands may cause the BEC 1012, 1010, 1008, 1006 to configure the network sections 1016, 1018, 1020, 1022 such that the controller 18B and adapter 30B are decoupled from the disk devices in sets 1024, 1026, 1028, 1030 so that the controller 18B and adapter 30B may no longer communicate with the disk devices. BEC 1008' and 1006' may configure the network sections 1020' and 1022' so as to permit the controller 18A to be able to actively exchange data and commands with the disk devices in sets 1028 and 1030 via FC loop 1152, and thereafter, the controller 18A may actively communicate with all of the disk devices in sets 1024, 1026, 1028, 1030. Data and commands from the failed controller 18B may be ignored by the circuits 1002, 1004.

Conversely, if while the circuits 1002, 1004 are in the first mode of operation, controller 18B determines that controller 18A or adapter 30A may have failed, the controller 18B detecting the failure may cause the circuit 1002 to initiate a failover processing with respect to circuit 1004 by which the controller 18A and adapter 30A will be completely decoupled from the disk devices in sets 1024, 1026, 1028, 1030. When the circuit 1002 initiates this failover processing, a predetermined sequence of commands may be exchanged between the BEC 1006 and BEC 1006' via the not shown control bus between the circuits 1002, 1004. Proper execution of the sequence of commands may cause the BEC 1012', 1010', 1008', 1006' to configure the network sections 1016', 1018', 1020', 1022' such that the failed controller 18A and adapter 30A are decoupled from the disk devices in sets 1024, 1026, 1028, 1030 so that the controller 18A may no longer communicate with the disk devices. BEC 1012 and 1010 may configure the network sections 1016 and 1018 so as to permit the controller 18B to be able to actively exchange data and commands with the disk devices in sets 1024 and 1026 via FC loop 1100, and thereafter, the controller 18B may actively communicate with all of the disk devices in sets 1024, 1026, 1028, 1030. Data and commands from the failed controller 18A and adapter 30A may be ignored by the circuits 1002, 1004.

Each of the circuits 1002, 1004 may also operate in a respective second mode of operation. When the BEC 1012, 1010, 1008, 1006 detect that ports 1032, 1034, 1036, and 1038 are coupled to active I/O ports of the adapter 30B, the BEC 1012, 1010, 1008, 1006 may configure the respective network sections 1016, 1018, 1020, 1022 such that the circuit 1002 operates in its respective second mode of operation. More specifically, in this second mode of operation, the BEC 1012, 1010, 1008, 1006 control, among other things, the respective control blocks in network sections 1016, 1018, 1020, 1022 such that the sections 1016, 1018, 1020, 1022 each form a respective FC loop, with the respective sets of disk devices 1024, 1026, 1028, 1030 comprising FC devices that may exchange data and commands with the disk I/O controller 18B, via these respective loops, respective ports 1032, 1034, 1036, and 1038, and adapter 30B, using FC AL protocol. In this second mode of operation of the circuit 1002, the respective I2C interfaces in ports 1032, 1034, 1036, and 1038 may be used to couple the BEC 1012, 1010, 1008, and 1006 to the adapter 30B, such that the BEC 1012, 1010, 1008, and 1006 may communicate with controller 18B.

When the BEC 1012', 1010', 1008', 1006' detect that ports 1032', 1034', 1036', and 1038' are coupled to active I/O ports of the adapter 30A, the BEC 1012', 1010', 1008', 1006' may configure the respective network sections 1016', 1018', 1020', 1022' such that the circuit 1004 operates in its respective second mode of operation. More specifically, in this second mode of operation, the BEC 1012', 1010', 1008', 1006' control, among other things, the respective control blocks in network sections 1016', 1018', 1020', 1022' such that the sections 1016', 1018', 1020', 1022' each form a respective FC loop, with the respective sets of disk devices 1024, 1026, 1028, 1030 comprising FC devices that may exchange data and commands with the disk I/O controller 18A, via these respective loops, respective ports 1032', 1034', 1036', and 1038', and adapter 30A, using FC AL protocol. In this second mode of operation of the circuit 1004, the respective 12C interfaces in ports 1032', 1034', 1036', and 1038' may be used to couple the BEC 1012', 1010', 1008', and 1006' to the adapter 30A, such that the BEC 1012', 1010', 1008', and 1006' may communicate with controller 18A.

When the circuits 1002, 1004 are in their respective second modes of operation and are functioning normally, and the adapters 30A, 30B and controllers 18A, 18B are also functioning normally, the four respective FC loops formed by the network sections 1016', 1018', 1020, and 1022 are active, and the four respective FC loops formed by the network sections 1016, 1018, 1020', and 1022' are inactive. That is, the controller 18B may actively communicate with the disk devices in sets 1028, 1030 (via the FC loops formed by the network sections 1020 and 1022, and ports 1036 and 1038), but controller 18B does not actively communicate with the disk devices in sets 1024, 1026, and conversely, controller 18A may actively communicate with the disk devices in sets 1024, 1026 (via the FC loops formed by the network sections 1016' and 1018', and the ports 1032' and 1034'), but controller 18A does not actively communicate with the disk devices in sets 1028, 1030.

If while the circuits 1002, 1004 are in their second modes of operation, controller 18A determines that controller 18B or adapter 30B may have failed, the controller 18A may cause the circuit 1004 to initiate a failover processing with respect to circuit 1002 by which the controller 18B and adapter 30B will be completely decoupled from the disk devices in sets 1024, 1026, 1028, 1030. When the circuit 1004 initiates this failover processing, a predetermined sequence of commands may be exchanged between the BEC 1006 and BEC 1006' via the not shown control bus between the circuits 1002, 1004. Proper execution of the sequence of commands may cause the BEC 1012, 1010, 1008, 1006 to configure the network sections 1016, 1018, 1020, 1022 such that the controller 18B and adapter 30B are decoupled from the disk devices in sets 1024, 1026, 1028, 1030 so that the controller 18B may no longer communicate with the disk devices. BEC 1008' and 1006' may configure the network sections 1020' and 1022' so as to permit the controller 18A to be able to actively exchange data and commands with the disk devices in sets 1028 and 1030 via the two FC loops formed by the sections 1020' and 1022', and thereafter, the controller 18A may actively communicate with all of the disk devices in the sets 1024, 1026, 1028, 1030. Data and commands from the failed controller 18B may be ignored by the circuits 1002, 1004.

Conversely, if while the circuits 1002, 1004 are in their second modes of operation, controller 18B determines that controller 18A or adapter 30A may have failed, the controller 18B may cause the circuit 1002 to initiate a failover processing with respect to circuit 1004 by which the controller 18A and adapter 30A will be completely decoupled from the disk devices in sets 1024, 1026, 1028, 1030. When the circuit 1002 initiates this failover processing, a predetermined sequence of commands may be exchanged between the BEC 1006 and BEC 1006' via the not shown control bus between the circuits 1002, 1004. Proper execution of the sequence of commands may cause the BEC 1012', 1010', 1008', 1006' to configure the network sections 1016', 1018', 1020', 1022' such that the failed controller 18A and adapter 30A are decoupled from the disk devices in sets 1024, 1026, 1028, 1030 so that the controller 18A may no longer communicate with the disk devices. BEC 1012 and 1010 may configure the network sections 1016 and 1018 so as to permit the controller 18B to be able to actively exchange data and commands with the disk devices in sets 1024 and 1026 via the respective FC loops formed by the sections 1016, 1018, and thereafter, the controller 18B may actively communicate with all of the disk devices in the sets 1024, 1026, 1028, 1030. Data and commands from the controller 18A and adapter 30A may be ignored by the circuits 1002, 1004.

Each respective BEC may comprise a respective field programmable gate array device that is programmed to carry out the operations described herein as being carried out by the respective BEC. Each respective BEC may include respective control/status registers (not shown) whose respective internal states may be examined and set by the respective I/O controller to which the respective BEC is coupled. By monitoring and setting such internal states, the respective I/O controller may control the various operations of the respective BEC. Additionally, each respective BEC may include respective functional circuitry blocks (not shown) for, among other things, managing the respective BEC's control/status registers, executing failover-related processes, controlling/monitoring operation of the respective network section to which the respective BEC is coupled, carrying out 12C communications involving the respective BEC, and for providing a human-readable display of status information related to operation of the system 1000 (e.g., via a not shown light emitting diode display mechanism).

Although the rate of transmission of data in each respective FC loop formed by the network sections in system 1000 may have an initial default value (e.g., at power up of the system 112 or reset of the circuits 1002, 1004) of 2.125 Gigabits (Gb) per second, the rate may be adjusted based upon commands provided from the controllers 18B, 18A to the respective BEC of the circuits 1002, 1004 to a lower rate (e.g., of 1.0625 Gb per second). The BEC in the circuits 1002, 1004 may then control the network sections in the circuits 1002, 1004 such that they operate at the lower data transmission rate.

Additionally, the control blocks in the respective configurable FC loop circuits comprised in each respective network section may be configured to sense if invalid FC data enters the respective network section that comprises such circuits, and to report such condition to the respective BEC responsible for controlling the respective network section. The respective BEC (together with other BEC in the respective circuit 1002 or 1004, as the case may be) may then undertake diagnostic routines to determine the configurable FC loop circuit from which the invalid FC data may have originated (hereinafter the "failed FC loop circuit"), and based upon the results of such routines, the BEC in the respective circuit 1002 or 1004 may coordinate their control of the network sections in the respective circuit 1002 or 1004 so as to remove or bypass the failed FC loop circuit from the FC communication network 1014 or 1014', as the case may be.

Also, in the event that one (e.g., circuit 1002) of the circuits 1002, 1004 is determined (e.g., by the controller 18B, using conventional failure detection techniques) to be failing, the controller 18B responsible for controlling the circuit 1002 may request that the other controller 18A in the controller redundancy pair 18A, 18B command the non-failed circuit 1004 to undertake the failover process that is appropriate given the modes of operation of the circuits 1002, 1004 (i.e., depending upon whether the circuits 1002, 1004 are in the first mode or the second mode of operation). After completion of the failover process, the controller 18B, adapter 30B, and the failing circuit 1002 may be decoupled from the disk devices of sets 1024, 1026, 1028, 1030, and controller 18A may be actively coupled via the circuit 1004 to the disk devices of sets 1024, 1026, 1028, 1030 such that the controller 18A may actively communicate with the disk devices in sets 1024, 1026, 1028, 1030.

Additionally, depending upon the processing intelligence possessed by the disk devices, the disk devices in sets 1024, 1026, 1028, 1030 may be able to determine if they are beginning to fail. If one of the disk devices in sets 1024, 1026, 1028, 1030 determines that it is beginning to fail, it may indicate such condition to the BEC that is responsible for controlling the network section to which the disk device is coupled, and/or may request that the BEC cause the disk device to be removed from or bypassed in the FC loop in networks 1014 and 1014' that currently is coupled to the failing disk device. Such indication/request may be forwarded to the BEC via a connection (not shown) made between the BEC and the connector in the back plane 332 to which the failing disk device is coupled. In response to this indication/request from the failing disk device, the BEC may command the network node in the network section to which the failing disk device is coupled to disconnect the failing disk device from the network node, so as to remove/bypass the failing disk device from the FC loop that was previously coupled to the disk device, and to pass data received by the network node from a preceding network node in the FC loop to the next succeeding network node in the FC loop, so as to ensure that the continuity of the FC loop is maintained despite failure of the disk device. Alternatively, or in addition thereto, the BEC in the circuits 1002, 1004 may be configured to determine, using conventional techniques, whether a disk device in the sets 1024, 1026, 1028, 1030 may be failing, and to cause the network node that is coupled to such a failing disk device to decouple the failing disk device from such network node so as to remove/bypass the failing disk device from the FC loop that was previous coupled to the failing disk device, and to pass data received by such network node from a preceding network node in the FC loop to the next succeeding network node in the FC loop, so as to ensure that the continuity of the FC loop is maintained despite failure of the disk device.

Figure 21:
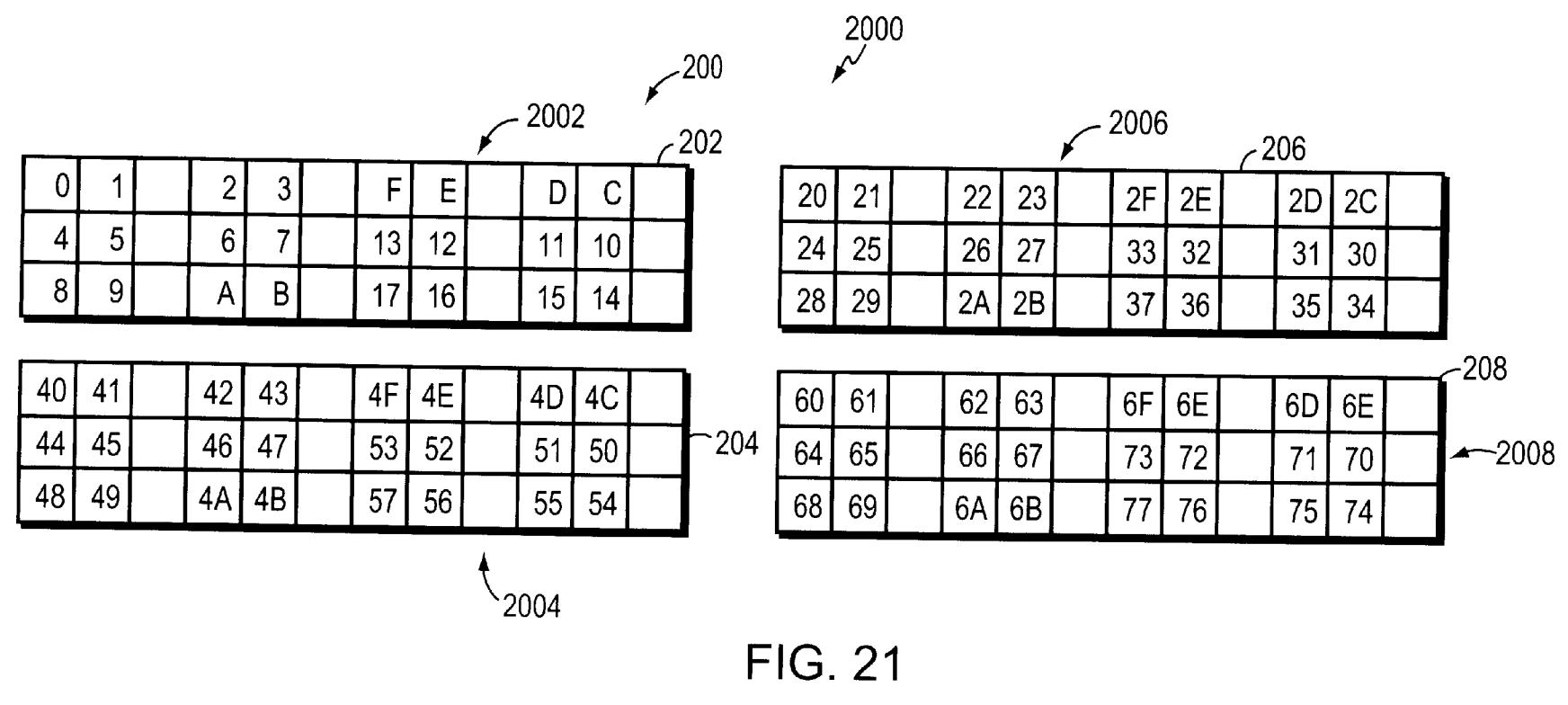

Illustrative embodiments of the present invention will now be described with particular reference being made to FIGS. 21–24. In FIG. 21, one actual configuration 2000 of mass storage devices that may be mounted in the mounting system 200 is shown symbolically. In configuration 2000, the mounting system 200 comprises four chassis 202, 204, 206, and 208. The chassis 202, 204, 206, and 208 mount respective sets 2002, 2004, 2006, and 2008 of twenty-four mass storage devices each. Each of the mass storage devices comprised in sets 2002, 2004, 2006, 2008 comprises a respective HH carrier and respective HH device of the types illustrated in the FIGS. 8–10.

In FIG. 21, the mass storage devices comprised in the sets 2002, 2004, 2006, 2008 are represented symbolically by the respective logical addresses (in hexadecimal, or hereinafter "hex") that are assigned to the devices in the configuration 2000. These addresses are shown in the respective relative mounting positions in the chassis 202, 204, 206, 208 of the respective mass storage devices to which the addresses are assigned in this configuration 2000.

In configuration 2000, the respective physical configurations of the sets 2002, 2004, 2006, 2008 of mass storage devices in the chassis 202, 204, 206, 208 are identical. Thus, for example, the mass storage device that is assigned the logical address 0 hex has a relative mounting position in chassis 202 (i.e., relative to the other mass storage devices mounted in the chassis 202) that corresponds to the relative mounting positions in chassis 206, 204, 208 of the mass storage devices that are assigned logical addresses of 20 hex, 40 hex, and 60 hex, respectively; similarly, the mass storage device that is assigned the logical address 1 hex has a relative mounting position in chassis 202 that corresponds to the relative mounting positions in chassis 206, 204, 208 of the mass storage devices that are assigned logical addresses of 21 hex, 41 hex, and 61 hex, respectively, and so forth.

More generally, in configuration 2000, one respective mass storage device mounted in chassis 202 may have a relative mounting position in chassis 202 that corresponds to the relative mounting position of another respective mass storage device mounted in chassis 206, if the logical address of that other respective mass storage device mounted in chassis 206 is equal to the sum of 20 hex and the logical address of the one respective mass storage device mounted in chassis 202. Similarly, one respective mass storage device mounted in chassis 202 may have a relative mounting position in chassis 202 that corresponds to the relative mounting position of another respective mass storage device mounted in chassis 204, if the logical address of that other respective mass storage device mounted in chassis 204 is equal to the sum of 40 hex and the logical address of the one respective mass storage device mounted in chassis 202. Additionally, one respective mass storage device mounted in chassis 202 may have a relative mounting position in chassis 202 that corresponds to the relative mounting position of another respective mass storage device mounted in chassis 208, if the logical address of that other respective mass storage device mounted in chassis 208 is equal to the sum of 60 hex and the logical address of the one respective mass storage device mounted in chassis 202.

Figure 22:
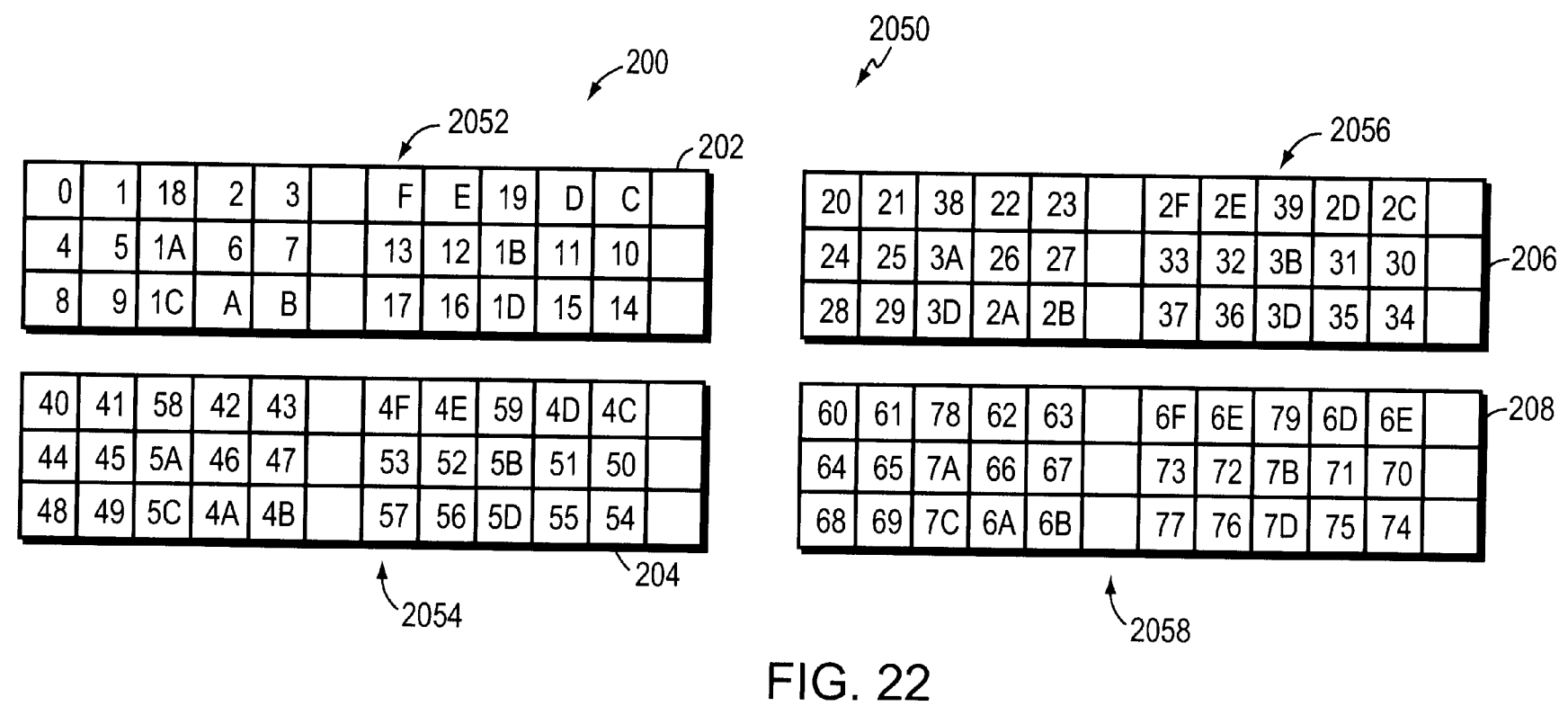

In FIG. 22, another actual configuration 2050 of mass storage devices that may be mounted in the mounting system 200 is shown symbolically. In configuration 2050, the mounting system 200 comprises four chassis 202, 204, 206, and 208. The chassis 202, 204, 206, and 208 mount respective sets 2052, 2054, 2056, and 2058 of thirty mass storage devices each.

In FIG. 22, the mass storage devices comprised in the sets 2052, 2054, 2056, 2058 are represented symbolically by the respective logical addresses (in hex) that are assigned to the devices in the configuration 2050. These addresses are shown in the respective relative mounting positions in the chassis 202, 204, 206, 208 of the respective mass storage devices to which the addresses are assigned in this configuration 2050.

In configuration 2050, each of the mass storage devices assigned addresses 0, 1, 18, F, E, 19, 4, 5, 1A, 13, 12, 1B, 8, 9, 1C, 17, 16, 1D, 20, 21, 38, 2F, 2E, 39, 24, 25, 3A, 33, 32, 3B, 28, 29, 3D, 37, 36, 3D, 40, 41, 58, 4F, 4E, 59, 44, 45, 5A, 53, 52, 5B, 48, 49, 5C, 57, 56, 5D, 60, 61, 78, 6F, 6E, 79, 64, 65, 7A, 73, 72, 7B, 68, 69, 7C, 77, 76, and 7D hex comprises a respective LP carrier and respective LP device of the types illustrated in the FIGS. 11–12. Each of the mass storage devices assigned the remaining addresses in the configuration 2050 comprises a respective HH carrier and respective HH device of the types illustrated in FIGS. 8–10.

In configuration 2050, the respective physical configurations of the sets 2052, 2054, 2056, 2058 of mass storage devices in the chassis 202, 204, 206, 208 are identical. Thus, for example, the mass storage device that is assigned the logical address 0 hex has a relative mounting position in chassis 202 (i.e., relative to the other mass storage devices mounted in the chassis 202) that corresponds to the relative mounting positions in chassis 206, 204, 208 of the mass storage devices that are assigned logical addresses of 20 hex, 40 hex, and 60 hex, respectively; similarly, the mass storage device that is assigned the logical address 1 has a relative mounting position in chassis 202 that corresponds to the relative mounting positions in chassis 206, 204, 208 of the mass storage devices that are assigned logical addresses of 21 hex, 41 hex, and 61 hex, respectively, and so forth.

More generally, in configuration 2050, one respective mass storage device mounted in chassis 202 may have a relative mounting position in chassis 202 that corresponds to the relative mounting position of another respective mass storage device mounted in chassis 206, if the logical address of that other respective mass storage device mounted in chassis 206 is equal to the sum of 20 hex and the logical address of the one respective mass storage device mounted in chassis 202. Similarly, one respective mass storage device mounted in chassis 202 may have a relative mounting position in chassis 202 that corresponds to the relative mounting position of another respective mass storage device mounted in chassis 204, if the logical address of that other respective mass storage device mounted in chassis 204 is equal to the sum of 40 hex and the logical address of the one respective mass storage device mounted in chassis 202. Additionally, one respective mass storage device mounted in chassis 202 may have a relative mounting position in chassis 202 that corresponds to the relative mounting position of another respective mass storage device mounted in chassis 208, if the logical address of that other respective mass storage device mounted in chassis 208 is equal to the sum of 60 hex and the logical address of the one respective mass storage device mounted in chassis 202.

Figure 23:
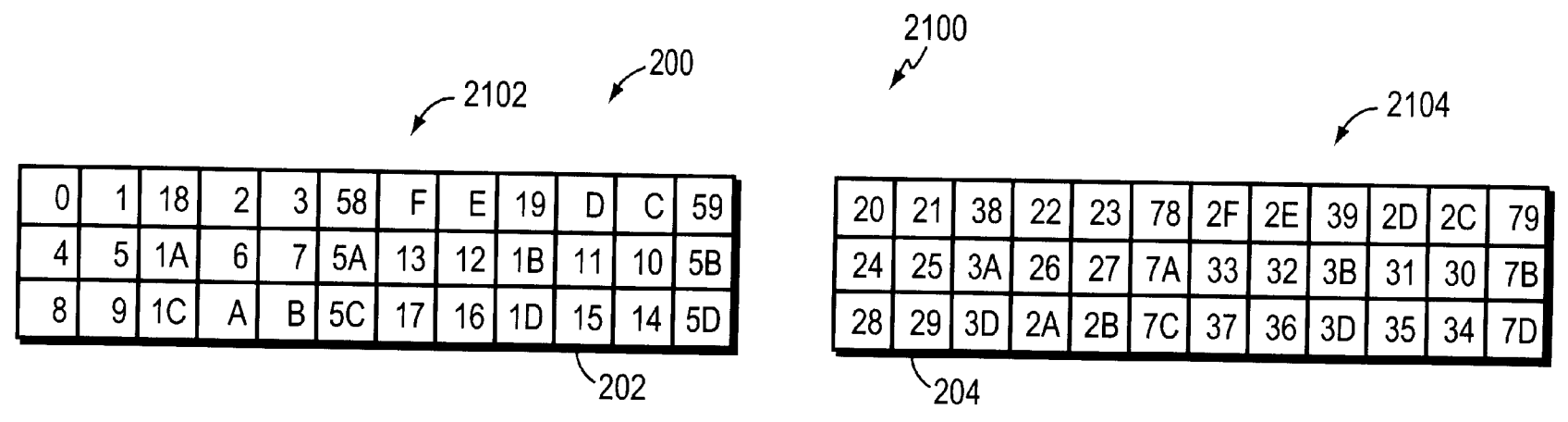

In FIG. 23, a third actual configuration 2100 of mass storage devices that may be mounted in the mounting system 200 is shown symbolically. In configuration 2100, the mounting system 200 comprises two chassis 202 and 204. The chassis 202 and 204 mount respective sets 2102 and 2104 of thirty-six mass storage devices each. Each of the mass storage devices comprised in sets 2102 and 2104 comprises a respective LP carrier and respective LP device of the types illustrated in the FIGS. 11–12.

In FIG. 23, the mass storage devices comprised in the sets 2102 and 2104 are represented symbolically by the respective logical addresses (in hex) that are assigned to the devices in the configuration 2100. These addresses are shown in the respective relative mounting positions in the chassis 202 and 204 of the respective mass storage devices to which the addresses are assigned in this configuration 2100.

In configuration 2100, the respective physical configurations of the sets 2102 and 2104 of mass storage devices in the chassis 202 and 204 are identical. Thus, for example, the mass storage device that is assigned the logical address 0 hex has a relative mounting position in chassis 202 that corresponds to the relative mounting position in chassis 204 of the mass storage device that is assigned logical address 20 hex; similarly, the mass storage device that is assigned the logical address 1 hex has a relative mounting position in chassis 202 that corresponds to the relative mounting position in chassis 204 of the mass storage device that is assigned logical address 21 hex, and so forth.

More generally, in configuration 2100, one respective mass storage device mounted in chassis 202 may have a relative mounting position in chassis 202 that corresponds to the relative mounting position of another respective mass storage device mounted in chassis 204, if the logical address of that other respective mass storage device mounted in chassis 204 is equal to the sum of 20 hex and the logical address of the one respective mass storage device mounted in chassis 202.

Figure 24:
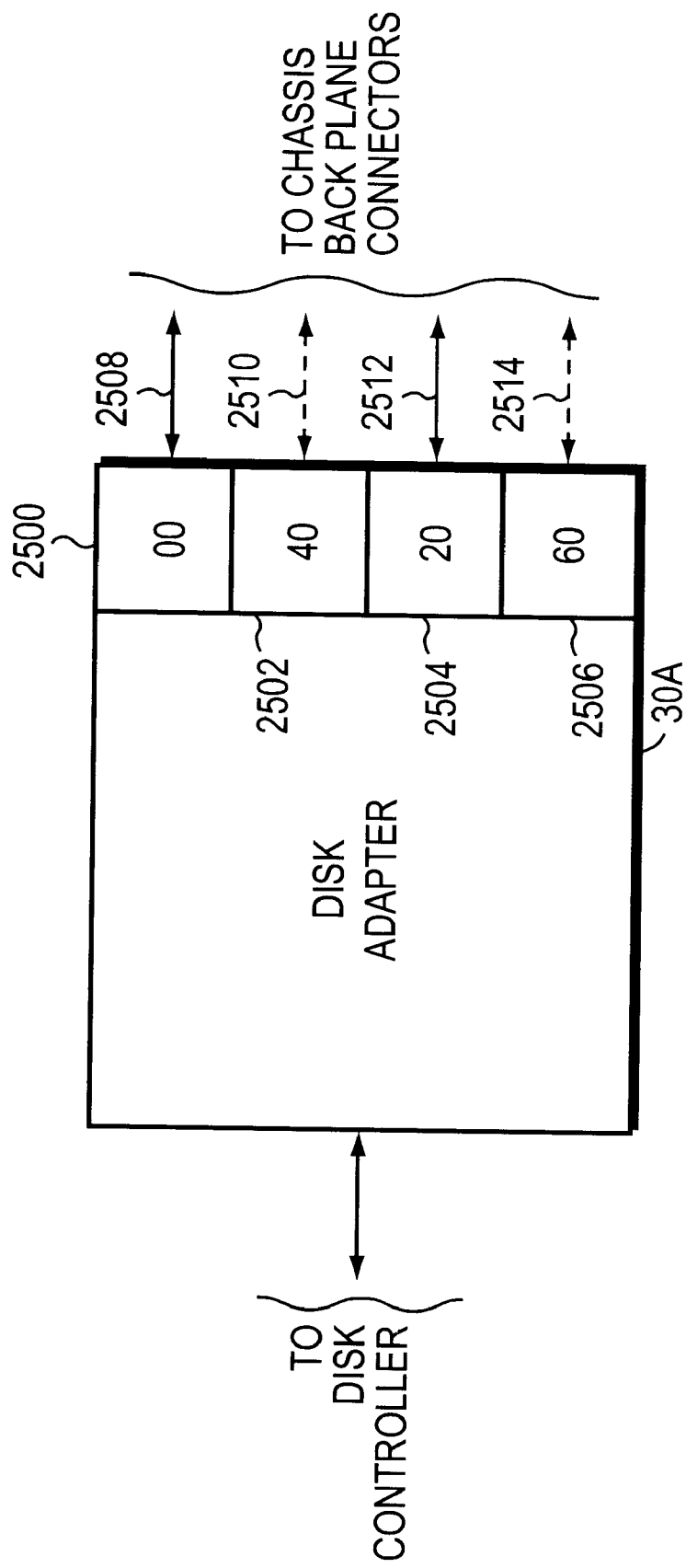
FIG. 24 is a highly schematic diagram illustrating logical connections that may be made between a disk adapter and multiple chassis in the data storage system of FIG. 2 whereby to facilitate implementation of the assignment of addresses according to an embodiment of the present invention.

An arrangement is illustrated schematically in FIG. 24 that may be used to couple adapter 30A to the chassis in the mounting system 200 in the configurations 2000, 2050, 2100, and thereby, to cause the above logical addresses to be assigned to the mass storage devices in these configurations 2000, 2050, 2100. It should be understood that, although not shown in the Figures, a respective arrangement that is similar to the arrangement shown in FIG. 24 may be used to couple the chassis of the mounting system 200 in configurations 2000, 2050, 2100 to the adapter 30B.

According to the arrangement shown in FIG. 24, if the mounting system 200 has either the configuration 2000 or the configuration 2050 and the adapter 30A comprises four I/O ports 2500, 2502, 2504, 2506, four special connector cables 2508, 2510, 2512, 2514 may be used to couple the four respective I/O ports 2500, 2502, 2504, 2506 of the adapter 30A to respective connectors (not shown) in the respective back planes of the four chassis 202, 204, 206, 208. These respective connectors in the back planes of the chassis 202, 204, 206, 208 may permit the ports 2500, 2502, 2504, 2506 of the adapter 30A to be coupled to respective configurable FC loop communication systems (i.e., having the same construction as system 1000) that may be housed in the chassis 202, 204, 206, 208. It should be understood that, although not shown in FIG. 24 for purposes of clarity of illustration, each of the ports 2500, 2502, 2504, 2506 of the adapter 30A may also be coupled to each of the chassis 202, 204, 206, 208 such that ports 2500, 2502, 2504, 2506 are coupled to the respective configurable FC loop communication systems housed in the chassis 202, 204, 206, 208, although the connections provided by the cables 2508, 2510, 2512, 2514 to the ports 2500, 2502, 2504, 2506 are as shown in FIG. 24.

Each of the special cables 2508, 2510, 2512, 2514 is hardwired to generate respective sets of signals that cause the adapter 30A and its associated controller 18A to assign to the respective chassis 202, 204, 206, 208 respective logical addresses 0 hex, 40 hex, 20 hex, and 60 hex. In configurations 2000, 2050, at start up or reset of the system 112, the controller 18A may assign a respective logical address to a respective mass storage device in a respective one of the chassis 202, 204, 206, 208 by summing together the logical address (i.e., 0 hex, 40 hex, 20 hex, or 60 hex) of the respective chassis 202, 204, 206, or 208 and the respective logical address assigned to the respective chassis back plane connector to which the mass storage device is coupled. The respective logical addresses that may be assigned to the chassis back plane connectors are discussed above, e.g., in connection with FIGS. 13 and 20.

Conversely, if the mounting system 200 has the configuration 2100, only two of the special connector cables 2508, 2512 may be used to couple two respective I/O ports 2500, 2504 of the adapter 30A to the respective not shown connectors in the respective back planes of the two chassis 202, 204. These respective connectors in the back planes of the chassis 202, 204 may permit the ports 2500, 2504 of the adapter 30A to be coupled to the respective configurable FC loop communication systems that may be housed in the chassis 202, 204. It should be understood that, although not shown in FIG. 24 for purposes of clarity of illustration, each of the ports 2500, 2502, 2504, 2506 of the adapter 30A may be coupled to each of the chassis 202, 204 so as to couple the ports 2500, 2502, 2504, 2506 to the respective configurable FC loop communication systems housed in the chassis 202, 204, although the connections provided by the cables 2508, 2512 to the ports 2500, 2504 are as shown in FIG. 24.

In configuration 2100, each of the special cables 2508, 2512 is hardwired to generate respective sets of signals that cause the adapter 30A and its associated controller 18A to assign to the respective chassis 202, 204 respective logical addresses 0 hex and 20 hex. In configuration 2100, at start up or reset of the system 112, the controller 18A may assign a respective logical address to a respective mass storage device in a respective one of the chassis 202, 204 by summing together the logical address (i.e., 0 hex or 20 hex) of the respective chassis 202 or 204 and the respective logical address assigned to the respective chassis back plane connector to which the mass storage device is coupled. The respective logical addresses that may be assigned to the chassis back plane connectors are discussed above, e.g., in connection with FIGS. 13 and 20.

After the controller 18A has assigned respective logical addresses to the mass storage devices mounted in the system 200, the controller 18A may utilize conventional FC communication protocol techniques to cause the mass storage devices to adopt their respective logical addresses. The controller 18A and mass storage devices in system 200 may then exchange data and commands, via the configurable FC loop communication systems housed in the chassis of the system 200, using FC communication protocol techniques.

Thus, it is evident that there has been provided, in accordance with the present invention, an address mapping technique for use in a mass storage mounting system that fully satisfies the aims and objectives, and achieve the advantages, hereinbefore set forth. The terms and expressions which have been employed in this application are used as terms of description and not of limitation, and there is no intention, in the use of such terms and expressions, of excluding any equivalents of the features shown and described or portions thereof, but it is recognized that various modifications are possible within the scope of the invention as claimed. For example, although the mounting system 200 has been described as being capable of mounting three different configurations of mass storage devices and as comprising up to four chassis, if the embodiments of the invention described herein are appropriately modified in ways apparent to those skilled in the art, it is possible for the mounting system to be able to mount additional, different configurations of mass storage devices and to comprise additional chassis, without departing from the present invention.

Other modifications are also possible. For example, although the cache 16, disck controllers 18A . . . 18N, and host controllers 22 . . . 24 have been described as being coupled together via bus system 14, if system 112 is appropriately modified, the cache 16, disk controllers 18A . . . 18N, and host controllers 22 . . . 24 may be coupled together and communicate via data transfer and messaging systems of the type disclosed in e.g., copending U.S. patent application Ser. No. 09/745,814, entitled, "Data Storage System Having Crossbar Switch with Multi-Staged Routing," filed Dec. 21, 2000; thus copending Application is owned by the owner of the subject application is hereby incorporated by reference in its entirety. Additional modifications are also possible. Accordingly, the present invention should be viewed broadly as encompassing all modifications, variations, alternatives and equivalents as may be encompassed by the hereinafter-appended claims.

What is claimed is:

1. Method for assigning numerical addresses to mass storage devices mounted in a mass storage device mounting system, the system being able to mount different respective configurations of the mass storage devices, the system including a first chassis and a second chassis, each of the chassis being able to mount a combination of two types of mass storage devices, one of the types having a first form factor, the other of the types having a second form factor that is different from the first form factor, the method comprising:

assigning a first subset of the numerical addresses to a first subset of the mass storage devices, the first subset of the mass storage devices being mounted in the first chassis;

assigning a second subset of the numerical addresses to a second subset of the mass storage devices, the second subset of the mass storage devices being mounted in the second chassis; and the assigning of the subsets of the numerical addresses being based upon an actual configuration of the mass storage devices that is mounted in the mounting system and respective addresses assigned to the first chassis and the second chassis.

2. Method according to claim 1, wherein each respective address in the second subset of the numerical addresses is equal to a respective combination of a respective corresponding address in the first subset of the numerical addresses and the address assigned to the second chassis.

3. Method according to claim 2, wherein the address assigned to the second chassis is generated by a cable connecting the second chassis to a port of a disk adapter.

4. Method according to claim 1, wherein each respective address in the second subset of the numerical addresses is equal to a respective summation of a respective corresponding address in the first subset of the numerical addresses and the address assigned to the second chassis.

5. Method according to claim 4, wherein, in a first configuration of the mass storage devices that may be mounted in the system, the system also comprises a third chassis and a fourth chassis, and the method further comprises:

assigning a third subset of the numerical addresses to a third subset of the mass storage devices, the third subset of the mass storage devices being mounted in the third chassis;

assigning a fourth subset of the numerical address to a fourth subset of the mass storage device, the fourth subset of the mass storage devices being mounted in the fourth chassis;

the first subset of the numerical addresses comprises only addresses that are greater than or equal to 0 hexadecimal and less than 20 hexadecimal;

the second subset of the numerical addresses comprises only addresses that are greater than or equal to 20 hexadecimal and less than 40 hexadecimal;

the third subset of the numerical addresses comprises only addresses that are greater that or equal to 40 hexadecimal and less than 60 hexadecimal; and the fourth subset of the numerical addresses comprises only addresses that are greater than or equal to 60 hexadecimal and less than or equal to 7D hexadecimal.

6. Method according to claim 5, wherein, in the first configuration, the first, second, third, and fourth chassis mount only mass storage devices that have a half height form factor.

7. Method according to claim 5, wherein, in the first configuration, the first, second, third, and fourth chassis mount respective combinations of mass storage devices, each of the respective combinations including mass storage devices that have a half height form factor and mass storage devices that have a low profile form factor.

8. Method according to claim 4, wherein:

the first subset of the numerical addresses comprises only addresses that are greater than or equal to 0 hexadecimal and less than 20 hexadecimal; and the second subset of the numerical addresses comprises only addresses that are greater than or equal to 20 hexadecimal and less than 40 hexadecimal.

* * * * *